US012690352B2

(12) United States Patent
Ju et al.

(10) Patent No.: US 12,690,352 B2
(45) Date of Patent: Jul. 21, 2026

(54) DISPLAY APPARATUS INCLUDING PILLAR SURROUNDED BY INSULATOR IN TRENCH

(71) Applicant: SAMSUNG DISPLAY CO., LTD., Yongin-si (KR)

(72) Inventors: Jinho Ju, Yongin-si (KR); Sungeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 398 days.

(21) Appl. No.: 18/199,034

(22) Filed: May 18, 2023

(65) Prior Publication Data

US 2024/0049550 A1     Feb. 8, 2024

(30) Foreign Application Priority Data

Aug. 8, 2022     (KR) ........................ 10-2022-0098840

(51) Int. Cl.
| | |
|---|---|
| *H10K 59/35* | (2023.01) |
| *H10K 59/121* | (2023.01) |
| *H10K 59/122* | (2023.01) |
| *H10K 59/124* | (2023.01) |
| *H10K 59/131* | (2023.01) |
| *H10K 102/00* | (2023.01) |

(52) U.S. Cl.
CPC ....... *H10K 59/353* (2023.02); *H10K 59/1213* (2023.02); *H10K 59/122* (2023.02); *H10K 59/124* (2023.02); *H10K 59/131* (2023.02); *H10K 2102/311* (2023.02)

(58) Field of Classification Search
CPC .. H10K 50/84; H10K 59/353; H10K 59/1213; H10K 59/122; H10K 59/124; H10K 59/131; H10K 59/121; H10K 59/352; H10K 59/35; H10K 77/111; G06F 1/1641; G09F 9/301; G09G 3/3233
See application file for complete search history.

(56) References Cited

U.S. PATENT DOCUMENTS

| | | | | |
|---|---|---|---|---|
| 7,834,543 | B2 * | 11/2010 | Takata | ............. H10K 59/80522 |
| | | | | 445/24 |
| 9,608,049 | B2 | 3/2017 | Lee | |
| 10,109,695 | B2 | 10/2018 | Choi et al. | |

(Continued)

FOREIGN PATENT DOCUMENTS

| | | | | |
|---|---|---|---|---|
| CN | 105810716 A | * | 7/2016 | ............. H10K 71/00 |
| CN | 110649087 A | | 1/2020 | |

(Continued)

*Primary Examiner* — Ida M Soward
(74) *Attorney, Agent, or Firm* — CANTOR COLBURN LLP

(57)     ABSTRACT

A display apparatus includes a substrate in which a first pixel area, a second pixel area, and a separation area are defined, the first pixel area and the second pixel area being apart from each other, and the separation area being between the first pixel area and the second pixel area, a first insulating layer which is disposed on the substrate and in which a trench corresponding to the separation area is defined, a pillar disposed in the trench, a height direction of the pillar being a thickness direction of the substrate, and a second insulating layer which is buried in the trench, surrounds at least a portion of the pillar, and includes a material different from a material of the first insulating layer.

20 Claims, 13 Drawing Sheets

(56) References Cited

U.S. PATENT DOCUMENTS

| | | | |
|---|---|---|---|
| 10,304,914 B2 | 5/2019 | Gunji | |
| 10,340,318 B2 | 7/2019 | Kim et al. | |
| 2007/0029548 A1 | 2/2007 | Yamazaki et al. | |
| 2018/0090549 A1* | 3/2018 | Hamada | H10K 59/38 |
| 2018/0162095 A1 | 6/2018 | Lim et al. | |
| 2019/0250662 A1 | 8/2019 | Jang et al. | |
| 2020/0212140 A1* | 7/2020 | Huh | H10K 59/121 |
| 2020/0303479 A1* | 9/2020 | Kim | H10K 59/1213 |
| 2021/0193758 A1 | 6/2021 | Choi et al. | |
| 2022/0159846 A1 | 5/2022 | Kim | |
| 2022/0309974 A1 | 9/2022 | Park et al. | |
| 2022/0367834 A1* | 11/2022 | Kinjo | H10K 50/844 |
| 2023/0137000 A1* | 5/2023 | You | H10K 59/124 |
| | | | 257/70 |

FOREIGN PATENT DOCUMENTS

| | | | | | |
|---|---|---|---|---|---|
| CN | 111710709 A | * | 9/2020 | | H10K 59/122 |
| CN | 111755617 A | * | 10/2020 | | H04M 1/0264 |
| JP | 20185160 A | | 1/2018 | | |
| KR | 100658758 B1 | * | 12/2006 | | H10K 59/8723 |
| KR | 1020150043890 A | | 4/2015 | | |
| KR | 1020170037786 A | | 4/2017 | | |
| KR | 1020170071974 A | | 6/2017 | | |
| KR | 20180068382 A | | 6/2018 | | |
| KR | 1020180059280 A | | 6/2018 | | |
| KR | 20210008977 A | | 1/2021 | | |
| KR | 20210081572 A | | 7/2021 | | |
| KR | 1020210147390 A | | 7/2021 | | |
| KR | 20220067587 A | | 5/2022 | | |

* cited by examiner

FIG. 9

DISPLAY APPARATUS INCLUDING PILLAR SURROUNDED BY INSULATOR IN TRENCH

This application claims priority to Korean Patent Application No. 10-2022-0098840, filed on Aug. 8, 2022, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Recently, a usage of display apparatuses is being diversified. In addition, as display apparatuses are becoming thinner and lighter, their range of use is being gradually extended.

As display apparatuses are used in various ways, there are various methods for designing the shape of a display apparatus. In addition, as an area occupied by a display area in a display apparatus is being increased, various functions applied or linked to the display apparatus are being added.

SUMMARY

Embodiments include a high-resolution display apparatus that is robust and flexible against an external impact.

The technical features to be achieved by the disclosure are not limited to the technical features mentioned above, and other technical features not mentioned will be clearly understood by one of ordinary skill in the art from the description of the disclosure. Additional features will be set forth in part in the description which follows and, in part, will be apparent from the description, or may be learned by practice of the presented embodiments of the disclosure.

In an embodiment of the disclosure, a display apparatus includes a substrate in which a first pixel area, a second pixel area, and a separation area are defined, the first pixel area and the second pixel area being apart from each other, and the separation area being between the first pixel area and the second pixel area, a first insulating layer which is disposed on the substrate and in which a trench corresponding to the separation area is defined, a pillar disposed in the trench, a height direction of the pillar being a thickness direction of the substrate, and a second insulating layer which is buried in the trench, surrounds at least a portion of the pillar and includes a material different from a material of the first insulating layer.

In an embodiment, a modulus of the pillar and a modulus of the second insulating layer may be different from each other.

In an embodiment, a modulus of the pillar may be greater than a modulus of the second insulating layer.

In an embodiment, the pillar may include an inorganic material.

In an embodiment, the pillar may include a conductive material.

In an embodiment, a planar shape of the pillar may be a circle or a polygon.

In an embodiment, the first insulating layer may include an inorganic material, and the second insulating layer may include an organic material.

In an embodiment, the display apparatus may further include a first pixel circuit disposed in the first pixel area and including a first semiconductor layer, a second pixel circuit disposed in the second pixel area and including a second semiconductor layer, and a connection line extending in one direction, connecting the first semiconductor layer to the second semiconductor layer and at least partially overlapping the separation area.

In an embodiment, the first semiconductor layer and the second semiconductor layer may be arranged in a same layer, and the connection line may be disposed between the first semiconductor layer and the substrate.

In an embodiment, the display apparatus may further include a data line which extends in the one direction on the first insulating layer and the second insulating layer, transmits a data signal to the first pixel circuit and the second pixel circuit and at least partially overlaps the separation area, and a driving voltage line extending in the one direction on the first insulating layer and the second insulating layer to transmit a driving voltage to the first pixel circuit and the second pixel circuit and at least partially overlapping the separation area.

In an embodiment, the display apparatus may further include a first display element disposed in the first pixel area, a second display element disposed in the second pixel area, a pixel-defining layer disposed on the first insulating layer and the second insulating layer and defining an emission area of each of the first display element and the second display element, and a spacer disposed on the pixel-defining layer and at least partially overlapping the pillar.

In an embodiment, the pixel-defining layer and the spacer may be unitary as a single body.

In an embodiment, the display apparatus may further include a first pixel circuit disposed in the first pixel area, a second pixel circuit disposed in the second pixel area, a third pixel circuit disposed in the first pixel area or the second pixel area, a first display element disposed in the first pixel area and electrically connected to the first pixel circuit, a second display element disposed in the second pixel area and electrically connected to the second pixel circuit, and a third display element disposed in the separation area and electrically connected to the third pixel circuit.

In an embodiment, the first pixel area may include a plurality of first sub-pixel areas, the second pixel area may include a plurality of second sub-pixel areas, a plurality of first auxiliary trenches and a plurality of second auxiliary trenches may be defined in the first insulating layer, the plurality of first auxiliary trenches respectively corresponding to boundaries of the plurality of first sub-pixel areas, and the plurality of second auxiliary trenches respectively corresponding to boundaries of the plurality of second sub-pixel areas, and the display apparatus may further include a plurality of first pixel isolation layers respectively buried in the plurality of first auxiliary trenches and each including a material different from a material of the first insulating layer, and a plurality of second pixel isolation layers respectively buried in the plurality of second auxiliary trenches and each including a material different from a material of the first insulating layer.

In an embodiment, the display apparatus may further include a plurality of first pixel circuits respectively arranged in first sub-pixel areas among the plurality of first sub-pixel areas, a plurality of second pixel circuits respectively arranged in second sub-pixel areas among the plurality of second sub-pixel areas, a plurality of third pixel circuits respectively arranged in other first sub-pixel areas among the plurality of first sub-pixel areas and other second sub-pixel areas among the plurality of second sub-pixel areas, a plurality of first display elements arranged in the first pixel area and electrically and respectively connected to the plurality of first pixel circuits, a plurality of second display elements arranged in the second pixel area and electrically and respectively connected to the plurality of second pixel circuits, and a plurality of third display elements arranged in the separation area and electrically and respectively connected to the plurality of third pixel circuits.

In an embodiment, two first pixel circuits among the plurality of first pixel circuits may be arranged between adjacent third pixel circuits arranged in the first pixel area, among the plurality of third pixel circuits, and two second pixel circuits among the plurality of second pixel circuits may be arranged between adjacent third pixel circuits arranged in the second pixel area, among the plurality of third pixel circuits.

In an embodiment, the plurality of first pixel isolation layers and the plurality of second pixel isolation layers may each include a same material as a material of the second insulating layer.

In an embodiment, the pillar may include a plurality of pillars, the plurality of pillars may be arranged apart from each other, and the second insulating layer may surround at least a portion of each of the plurality of pillars.

In an embodiment, in a plan view, the second insulating layer may have a honeycomb structure.

In an embodiment, a folding area and a non-folding area may be further defined in the substrate, the folding area and the non-folding area each including the first pixel area, the second pixel area, and the separation area, and a length direction of each of the first pixel area, the second pixel area, and the separation area may be parallel to a folding axis of the folding area.

Other features and advantages than those described above will become apparent from the following drawings, claims, and detailed description of the disclosure.

These general and illustrative embodiments may be implemented by a system, a method, a computer program, or any combinations thereof.

BRIEF DESCRIPTION OF THE DRAWINGS

The above and other features and advantages of illustrative embodiments of the disclosure will be more apparent from the following description taken in conjunction with the accompanying drawings, in which:

FIG. 9 is a cross-sectional view taken along line VII-VII', illustrating a portion of the display apparatus of FIG. 8;

DETAILED DESCRIPTION

Figure 1:
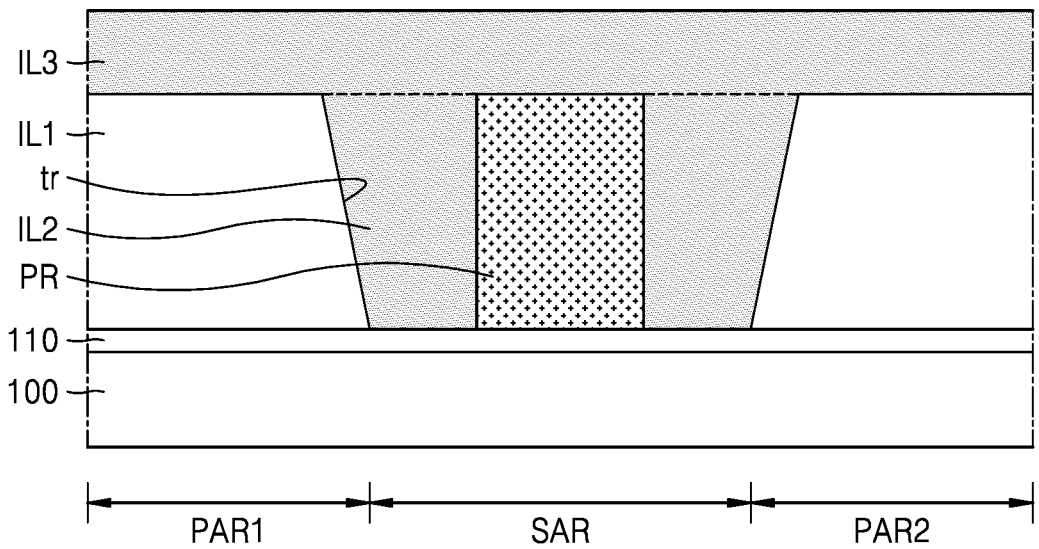
FIG. 1 is a cross-sectional view schematically illustrating an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments of the disclosure will be described in detail with reference to the accompanying drawings. When describing embodiments with reference to the drawings, the same or corresponding elements are denoted by the same reference numerals, and redundant descriptions thereof are omitted.

In the following embodiments, although the terms "first," "second," etc., may be used to describe various elements, such elements should not be limited to the above terms. The above terms are used to distinguish one element from another.

In the following embodiments, an expression used in the singular encompasses the expression of the plural, unless it has a clearly different meaning in the context.

In the following embodiments, the terms "comprise," "comprising," "include" and/or "including" are used to specify the presence of stated features or elements, but do not preclude the addition of one or more other features or elements.

In the following embodiments, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of description. Because sizes and thicknesses of elements in the drawings are arbitrarily illustrated for convenience of description, for example, the disclosure is not limited thereto.

When an embodiment may be implemented differently, a certain process order may be performed differently from the described order. Two processes described in succession may be performed substantially simultaneously, or may be performed in an order opposite to the order described, for example.

As used herein, "A and/or B" refers to A, B, or A and B. In addition, "at least one of A and B" refers to A, B, or A and B.

In the following embodiments, when a layer, region, or element is referred to as being "connected" to another layer, region, or element, it may be "directly connected" to the other layer, region, or element, and/or may be "indirectly connected" to the other layer, region, or element with one or more intervening layers, regions, or elements therebetween. When a layer, region, or element is referred to as being "electrically connected" to another layer, region, or element, it may be "directly electrically connected" to the other layer, region, or element, and/or may be "indirectly electrically connected" to the other layer, region, or element with one or more intervening layers, regions, or elements therebetween, for example.

In the following embodiments, the x-axis, the y-axis, and the z-axis are not limited to three axes of a rectangular coordinate system, and may be interpreted in a broader sense. The x-axis, the y-axis, and the z-axis may be perpendicular to one another, or may represent different directions that are not perpendicular to one another, for example.

FIG. 1 is a cross-sectional view schematically illustrating an embodiment of a display apparatus.

Referring to FIG. 1, the display apparatus may include a substrate 100, a barrier layer 110, a first insulating layer IL1, a pillar PR, a second insulating layer IL2, and a third insulating layer IL3.

A first pixel area PAR1, a second pixel area PAR2, and a separation area SAR may be defined in the substrate 100. The first pixel area PAR1 and the second pixel area PAR2 may be apart from each other. The separation area SAR may be disposed between the first pixel area PAR1 and the second pixel area PAR2. The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the above-described polymer resin and an inorganic layer.

The barrier layer 110 may be disposed on the substrate 100. The barrier layer 110 may prevent or reduce penetration of impurities from the substrate 100, etc., into the display apparatus. The barrier layer 110 may include an inorganic material, such as oxide or nitride, an organic material, or an organic-inorganic composite material, and may have a single-layered or multi-layered structure including an inorganic material and an organic material.

The first insulating layer IL1 may be disposed on the barrier layer 110. A trench tr corresponding to the separation area SAR may be defined in the first insulating layer IL1. The first insulating layer IL1 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The pillar PR may be disposed in the trench tr. A height direction of the pillar PR may be a thickness direction of the substrate 100. The pillar PR may include a high-hardness material. In an embodiment, the pillar PR may have a single-layered or multi-layered structure including an inorganic material, for example. The pillar PR may include $SiO_2$, $SiN_x$, SiON, $Al_2O_3$, $TiO_2$, $Ta_2O_5$, $HfO_2$, or $ZnO_2$. In an alternative embodiment, the pillar PR may include a conductive material including molybdenum (Mo), aluminum (Al), copper (Cu), or titanium (Ti), etc., and may be a multi-layer or a single layer including the above-described materials.

Figure 8:
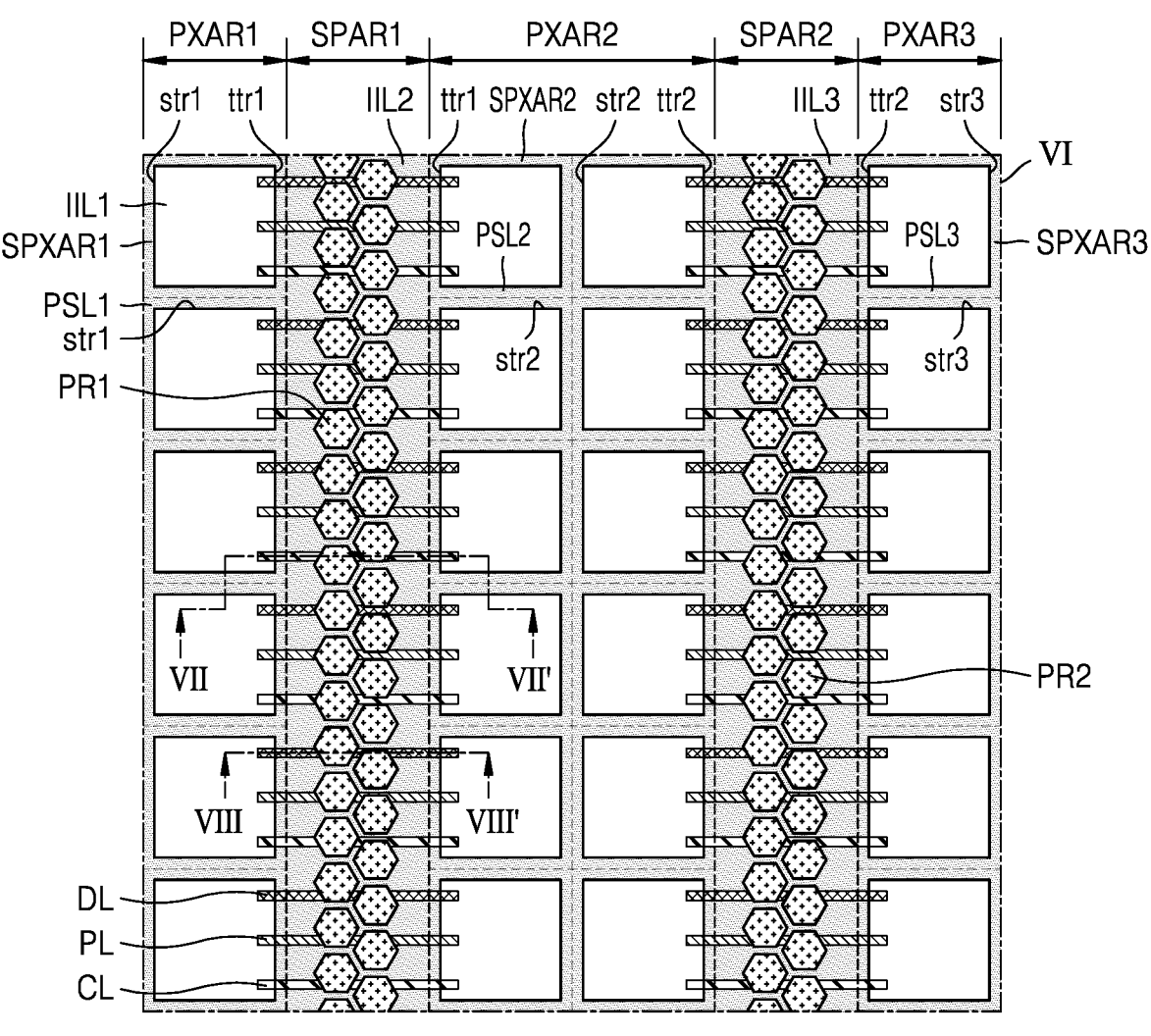
FIG. 8 is an enlarged plan view illustrating the region VI of FIG. 3.

In an embodiment, a planar shape of the pillar PR may be a circle or a polygon. In an embodiment, as shown in FIG. 8 described below, the planar shape of the pillar PR may be a hexagon, for example. The pillar PR may be a hexagonal prism. This feature is described in more detail below with reference to FIGS. 8, 12, and 13.

When the pillar PR including a high-hardness material is disposed in the trench tr, an external impact from outside the display apparatus may be prevented from reaching only pixel circuits that are arranged in the first pixel area PAR1 and the second pixel area PAR2 to drive display elements. The external impact may be distributed to the pillar PR, and the pixel circuits may be protected.

The second insulating layer IL2 may be buried in the trench tr to surround at least a portion of the pillar PR. As the second insulating layer IL2 is disposed in the trench tr, a step difference in the first insulating layer IL1 due to the trench tr may be removed or reduced. The second insulating layer IL2 may include a material different from that of the first insulating layer IL1. In an embodiment, the second insulating layer IL2 may be a single layer or a multi-layer including an organic material, for example. The second insulating layer IL2 may include a general-purpose polymer, such as benzocyclobutene ("BCB"), polyimide, hexamethyldisiloxane ("HMDSO"), polymethylmethacrylate ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

In an embodiment, a modulus of the pillar PR and a modulus of the second insulating layer IL2 may be different from each other. In an embodiment, the modulus of the pillar PR may be greater than the modulus of the second insulating layer IL2, for example. When the second insulating layer IL2 having a relatively small modulus at least partially surrounds the pillar PR having a relatively large modulus, strain may be absorbed, and the strength of the display apparatus may be improved.

Although FIG. 1 shows that the second insulating layer IL2 surrounds a side surface of the pillar PR, in another embodiment, the second insulating layer IL2 may cover an upper surface of the pillar PR.

The third insulating layer IL3 may be disposed on the first insulating layer IL1 and the second insulating layer IL2. The third insulating layer IL3 may be a single layer or a multi-layer including an organic material, and may provide a flat upper surface. The third insulating layer IL3 may include a general-purpose polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

In an embodiment, the third insulating layer IL3 may be unitary as a single body with the second insulating layer IL2.

Figure 2:
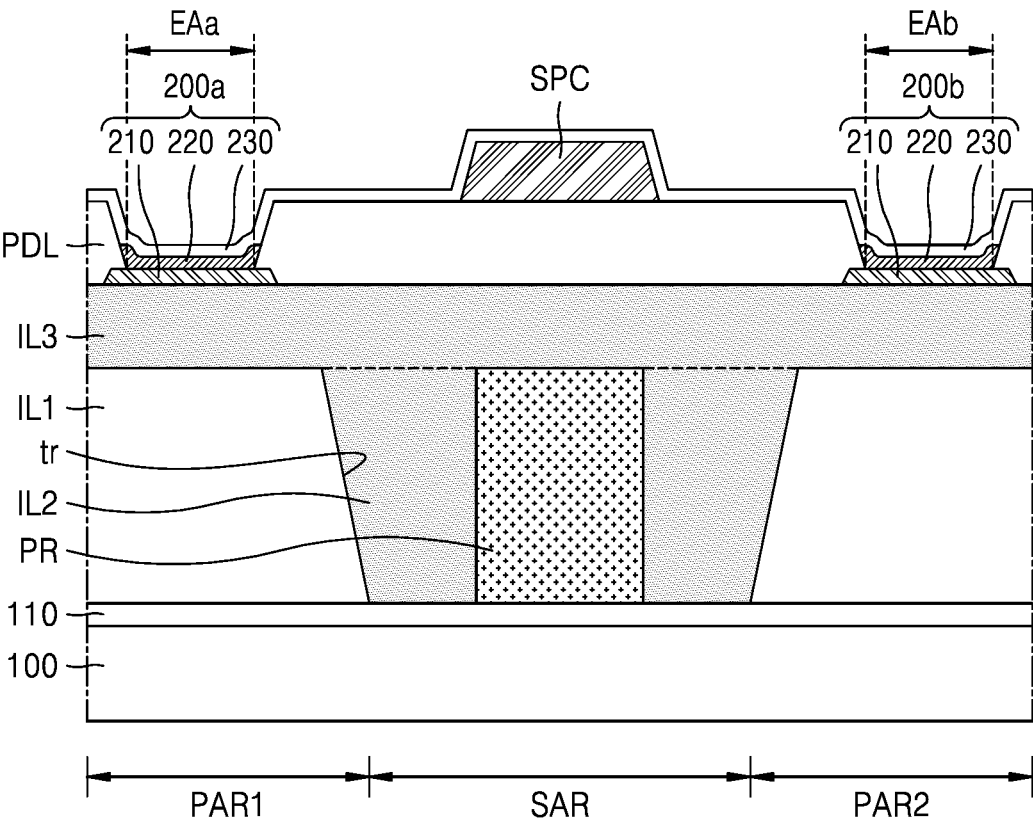
FIG. 2 is a cross-sectional view schematically illustrating an embodiment of a display apparatus.

FIG. 2 is a cross-sectional view schematically illustrating an embodiment of a display apparatus. FIG. 2 is a modification of FIG. 1, and differs therefrom in terms of the structures of a pixel-defining layer and a spacer. Hereinafter, redundant descriptions of FIGS. 1 and 2 are omitted, and differences therebetween are mainly described.

Referring to FIG. 2, the display apparatus may further include a first display element 200*a*, a second display element 200*b*, a pixel-defining layer PDL, and a spacer SPC.

The first display element 200*a* and the second display element 200*b* may be disposed on the third insulating layer IL3. The first display element 200*a* may be disposed in the first pixel area PAR1, and the second display element 200*b* may be disposed in the second pixel area PAR2. The first display element 200*a* and the second display element 200*b* may be organic light-emitting diodes. Each of the first display element 200*a* and the second display element 200*b* may include a pixel electrode 210, an intermediate layer 220 including an organic emission layer, and an opposite electrode 230.

The pixel electrode 210 may be a (semi-)transmissive electrode or a reflective electrode. In some embodiments, the pixel electrode 210 may include a reflective layer including silver (Ag), magnesium (Mg), Al, platinum (Pt), palladium (Pd), gold (Au), nickel (Ni), neodymium (Nd), iridium (Ir), chromium (Cr), or any combinations thereof, and a transparent or semi-transparent electrode layer formed on the reflective layer. The transparent or semi-transparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some embodiments, the pixel electrode 210 may include ITO/Ag/ITO.

The pixel-defining layer PDL may be disposed on the third insulating layer IL3. The pixel-defining layer PDL may cover an edge of the pixel electrode 210, and an opening exposing a central portion of the pixel electrode 210 may be defined in the pixel-defining layer PDL. Respective emission areas EAa and EAb of the first display element 200*a* and the second display element 200*b* may be defined by the opening.

The pixel-defining layer PDL may prevent an arc, etc., from occurring on the edge of the pixel electrode 210 by increasing a distance between the edge of the pixel electrode 210 and the opposite electrode 230 above the pixel electrode 210.

The pixel-defining layer PDL may include at least one organic insulating material of polyimide, polyamide, acrylic resin, BCB, and phenolic resin, and may be formed by spin coating, etc. The pixel-defining layer PDL may include an organic insulating material. In an alternative embodiment, the pixel-defining layer PDL may include an inorganic insulating material, such as $SiN_x$, SiON, or $SiO_2$. In an alternative embodiment, the pixel-defining layer PDL may include an organic insulating material and an inorganic insulating material. In some embodiments, the pixel-defining layer PDL may include a light-blocking material, and may have a black color. The light-blocking material may include carbon black, carbon nanotubes, resin or paste including black dye, metal particles (e.g., Ni, Al, Mo, or any alloys thereof), metal oxide particles (e.g., chromium oxide), or metal nitride particles (e.g., chromium nitride). When the pixel-defining layer PDL includes the light-blocking material, reflection of external light due to metal structures arranged below the pixel-defining layer PDL may be reduced.

The spacer SPC may be disposed on the pixel-defining layer PDL. The spacer SPC may be disposed in the separation area SAR. The spacer SPC may at least partially overlap the pillar PR. When the spacer SPC at least partially overlaps the pillar PR, an external impact may be distributed to the spacer SPC, and the strength of the display apparatus may be further improved.

The spacer SPC may be provided to prevent damage to the substrate 100 in a method of manufacturing a display apparatus. A mask sheet may be used when manufacturing a display apparatus. In this case, when the mask sheet enters the opening of the pixel-defining layer PDL or is brought into close contact with the pixel-defining layer PDL to deposit a deposition material on the substrate 100, a defect in which a portion of the substrate 100 is damaged or broken by the mask sheet may be prevented. The spacer SPC may include an organic insulating material, such as polyimide. In an alternative embodiment, the spacer SPC may include an inorganic insulating material, such as $SiN_x$ or $SiO_2$, or may include an organic insulating material and an inorganic insulating material.

In an embodiment, the spacer SPC may include a material different from that of the pixel-defining layer PDL. In an alternative embodiment, in another embodiment, the spacer SPC may include the same material as that of the pixel-defining layer PDL. In this case, the pixel-defining layer PDL and the spacer SPC may be formed together in a mask process using a halftone mask, etc. The pixel-defining layer PDL and the spacer SPC may be unitary as a single body.

The intermediate layer 220 may be disposed in the opening defined by the pixel-defining layer PDL, and may include an organic emission layer. The organic emission layer may include an organic material including a fluorescent or phosphorescent material emitting red, green, blue, or white light. The organic emission layer may include a low-molecular weight organic material or a high-molecular weight organic material. A functional layer, such as a hole transport layer ("HTL"), a hole injection layer ("HIL"), an electron transport layer ("ETL"), or an electron injection layer ("EIL"), may be optionally further disposed below and above the organic emission layer.

The opposite electrode 230 may be a transmissive electrode or a reflective electrode. In some embodiments, the opposite electrode 230 may be a transparent or semi-transparent electrode, and may include a metal thin film having a substantially small work function, including lithium (Li), calcium (Ca), lithium fluoride (LiF)/Ca, LiF/Al, Al, Ag, Mg, or any combinations thereof. In addition, a transparent conductive oxide ("TCO") layer, such as ITO, IZO, ZnO, or $In_2O_3$, may be further disposed on the metal thin film. The opposite electrode 230 may be disposed over a display area, and may be disposed on the intermediate layer 220 and the pixel-defining layer PDL. The opposite electrode 230 may be unitary as a single body in the first display element 200*a* and the second display element 200*b* to correspond to the pixel electrodes 210.

Because the first display element 200*a* and the second display element 200*b* may be easily damaged by external moisture or oxygen, an encapsulation layer (not shown) may cover and protect the first display element 200*a* and the second display element 200*b*. The encapsulation layer may cover the display area, and may extend to at least a portion of a peripheral area. The encapsulation layer may include a first inorganic encapsulation layer, an organic encapsulation layer, and a second inorganic encapsulation layer.

Figure 3:
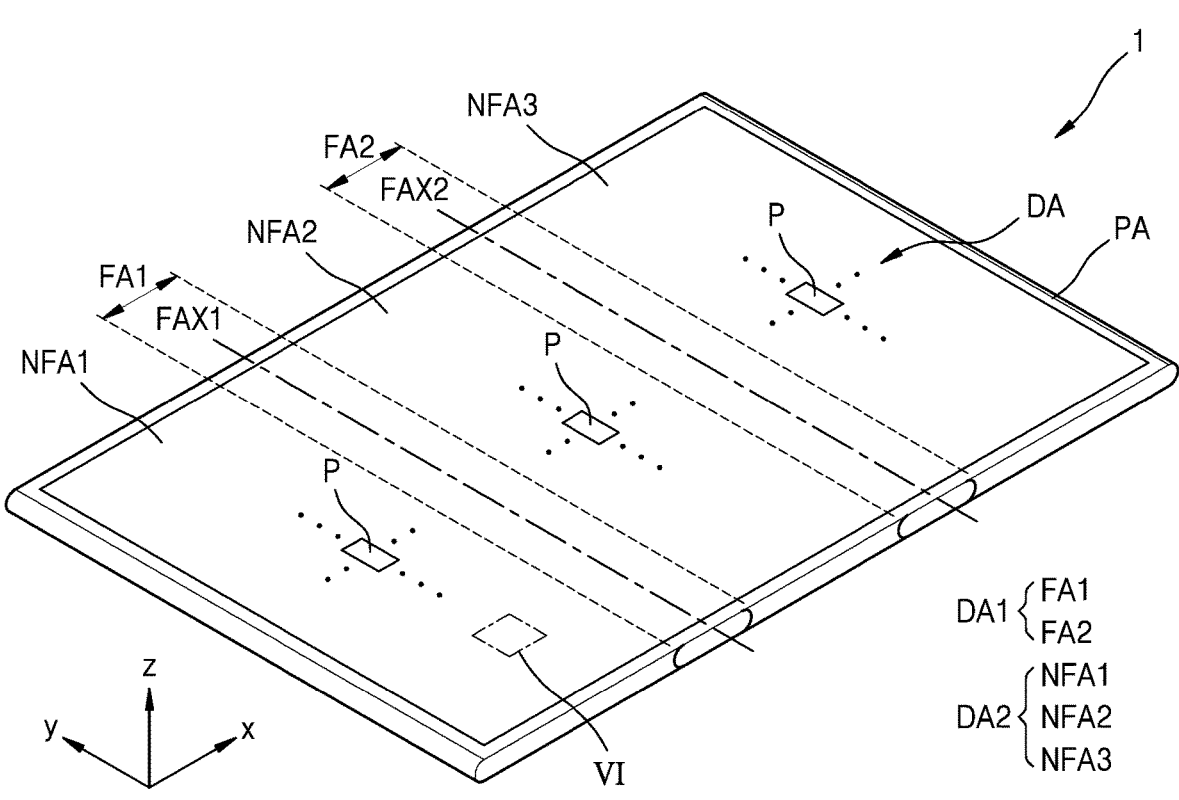
FIG. 3 is a perspective view schematically illustrating an embodiment of a display apparatus.
Figure 4:
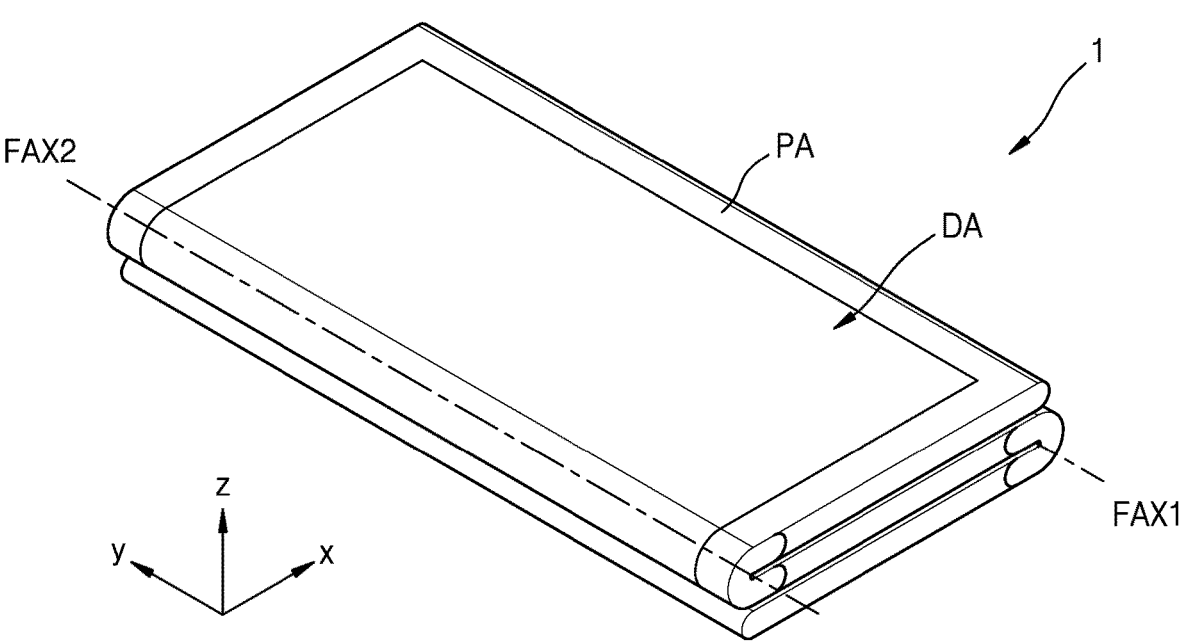
FIG. 4 is a perspective view schematically illustrating an embodiment of a display apparatus in a folded shape.

FIG. 3 is a perspective view schematically illustrating an embodiment of a display apparatus. FIG. 4 is a perspective view schematically illustrating an embodiment of a display apparatus in a folded shape. FIG. 3 is a perspective view illustrating the display apparatus in an unfolded state, and FIG. 4 is a perspective view illustrating the display apparatus in a folded state.

A display apparatus 1 may be an apparatus for displaying a moving image or a still image, and may be used as a display screen of various products including not only portable electronic devices, such as a mobile phone, a smartphone, a tablet personal computer, a mobile communication terminal, an electronic notebook, an electronic book, a portable multimedia player ("PMP"), a navigation device, and an ultra-mobile personal computer ("UMPC"), but also other devices, such as a television, a notebook computer, a monitor, a billboard, and an Internet of things ("IoT") device. In addition, the display apparatus 1 may be used in wearable devices, such as a smart watch, a watch phone, a glasses-type display, and a head-mounted display ("HMD"). In addition, the display apparatus 1 may be used as an instrument panel of a vehicle, a center information display ("CID") disposed on a center fascia or a dashboard of a vehicle, a room mirror display that replaces a side mirror of a vehicle, or a display disposed on a rear surface of a front seat, as entertainment for a back seat of the vehicle.

As shown in FIG. 3, the display apparatus 1 may be unfolded to be entirely flat. As shown in FIG. 4, the display apparatus 1 may be folded or bent.

In an embodiment, the display apparatus 1 may be folded such that display surfaces thereof face each other. In another embodiment, the display apparatus 1 may be folded such that a display surface thereof faces the outside. In this regard, the term "display surface" refers to a surface on which an image is displayed. A display surface may include a display area DA and a peripheral area PA, and an image may be provided to a user through the display area DA. In this regard, the term "folded" indicates that a shape is not fixed but is deformable from the original shape to another shape, and may include a shape that is folded along at least one particular line, that is, a folding axis, curved, or rolled like a scroll.

Referring to FIGS. 3 and 4, the display apparatus 1 may include the display area DA and the peripheral area PA outside the display area DA. The display area DA may be an area in which a plurality of pixels P is arranged to display an image. The peripheral area PA may surround the display area DA, and may be a non-display area in which no pixel P is disposed.

The display area DA may include a first display area DA1 and a second display area DA2. The first display area DA1 may be a folding area that is flexible and foldable, and there may be one or more folding areas. The second display area DA2 may be a non-folding area that is not foldable. In an embodiment, an area that is not foldable may be also referred to as a non-folding area, but this is only for convenience of description. The term "non-folding" may include a case where an area is not flexible and is thus rigid, a case where an area is flexible but is less flexible than a folding area, and a case where an area is flexible but is not foldable. The display apparatus 1 may display images in the first display area DA1 and the second display area DA2.

The first display area DA1 may include a first folding area FA1 and a second folding area FA2. The first folding area FA1 may be folded with respect to a first folding axis FAX1, and the second folding area FA2 may be folded with respect to a second folding axis FAX2. In an embodiment, the first folding area FA1 and the second folding area FA2 may have similar areas. In another embodiment, the first folding area FA1 and the second folding area FA2 may have different areas from each other.

The second display area DA2 may include a first non-folding area NFA1, a second non-folding area NFA2, and a third non-folding area NFA3. The first folding area FA1 may be disposed between the first non-folding area NFA1 and the second non-folding area NFA2, and the second folding area FA2 may be disposed between the second non-folding area NFA2 and the third non-folding area NFA3.

Various electronic devices or printed circuit boards may be electrically attached to the peripheral area PA, and a voltage line which supplies power for driving a display element may be disposed in the peripheral area PA. In an embodiment, a scan driver which provides a scan signal to each pixel P, a data driver which provides a data signal to each pixel P, a supply line via which a signal input to the scan driver and the data driver is input (e.g., a clock signal line, a carry signal line, a driving voltage line, etc.), and a main power line may be disposed in the peripheral area PA, for example.

Figure 5:
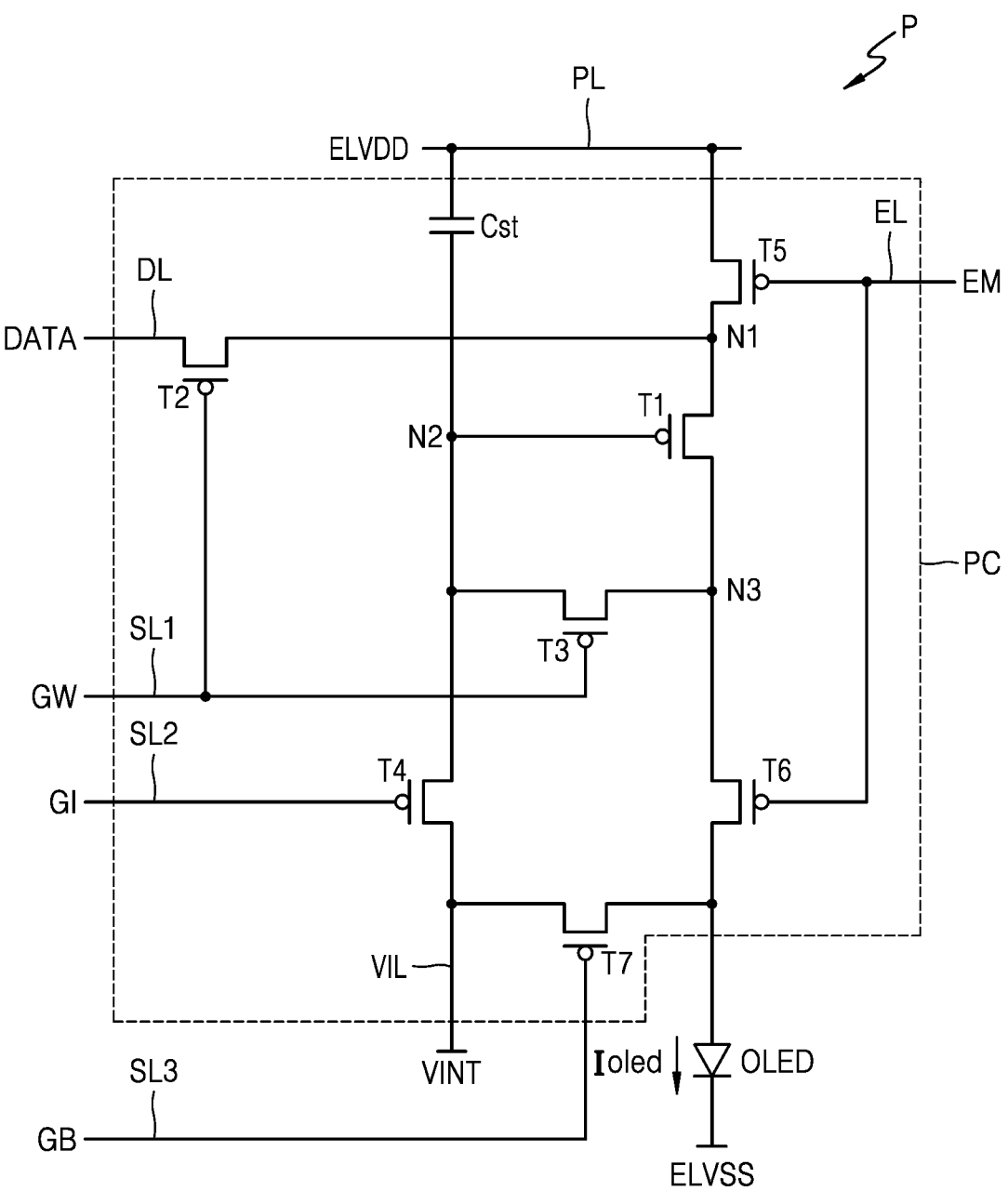
FIG. 5 is an equivalent circuit diagram illustrating a pixel included in the display apparatus of FIG. 3.

FIG. 5 is an equivalent circuit diagram illustrating a pixel included in the display apparatus of FIG. 3.

Referring to FIG. 5, a pixel circuit PC may include first to seventh transistors T1 to T7. According to the type (N-type or P-type) and/or operating conditions of a transistor, a first terminal of the transistor may be a source electrode or a drain electrode, and a second terminal thereof may be an electrode different from the first terminal. In an embodiment, when the first terminal is a source electrode, the second terminal may be a drain electrode, for example.

The pixel circuit PC may be connected to a first scan line SL1 which transmits a first scan signal GW, a second scan line SL2 which transmits a second scan signal GI, a third scan line SL3 which transmits a third scan signal GB, an emission control line EL which transmits an emission control signal EM, a data line DL which transmits a data signal DATA, a driving voltage line PL which transmits a driving voltage ELVDD, and an initialization voltage line VIL which transmits an initialization voltage VINT. The pixel circuit PC may be connected to an organic light-emitting diode OLED as a display element.

The first transistor T1 may be connected between the driving voltage line PL and the organic light-emitting diode OLED. The first transistor T1 may be connected between a first node N1 and a third node N3. The first transistor T1 may be connected to the driving voltage line PL via the fifth transistor T5, and may be electrically connected to the organic light-emitting diode OLED via the sixth transistor T6. The first transistor T1 may include a gate electrode connected to a second node N2, a first terminal connected to the first node N1, and a second terminal connected to the third node N3. The driving voltage line PL may transmit the driving voltage ELVDD to the first transistor T1. The first transistor T1 may serve as a driving transistor, and may receive the data signal DATA according to a switching operation of the second transistor T2 and supply a driving current Ioled to the organic light-emitting diode OLED.

The second transistor T2 (or data-writing transistor) may be connected between the data line DL and the first node N1. The second transistor T2 may be connected to the driving voltage line PL via the fifth transistor T5. The second transistor T2 may include a gate electrode connected to the first scan line SL1, a first terminal connected to the data line DL, and a second terminal connected to the first node N1. The second transistor T2 may be turned on according to the first scan signal GW received via the first scan line SL1 to perform a switching operation of transmitting the data signal DATA received via the data line DL to the first node N1.

The third transistor T3 (or compensation transistor) may be connected between the second node N2 and the third node N3. The third transistor T3 may be connected to the organic light-emitting diode OLED via the sixth transistor T6. The third transistor T3 may include a gate electrode connected to the first scan line SL1, a first terminal connected to the second node N2, and a second terminal connected to the third node N3. The third transistor T3 may be turned on according to the first scan signal GW received via the first scan line SL1 to compensate for a threshold voltage of the first transistor T1 by diode-connecting the first transistor T1.

The fourth transistor T4 (or first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on according to the second scan signal GI received via the second scan line SL2 to initialize the gate electrode of the first transistor T1 by transmitting the initialization voltage VINT to the gate electrode of the first transistor T1.

The fifth transistor T5 (or first emission control transistor) may be connected between the driving voltage line PL and the first node N1. The sixth transistor T6 (or second emission control transistor) may be connected between the third node N3 and the organic light-emitting diode OLED. The fifth transistor T5 may include a gate electrode connected to the emission control line EL, a first terminal connected to the driving voltage line PL, and a second terminal connected to the first node N1. The sixth transistor T6 may include a gate electrode connected to the emission control line EL, a first terminal connected to the third node N3, and a second terminal connected to a pixel electrode of the organic light-emitting diode OLED. The fifth transistor T5 and the sixth transistor T6 may be simultaneously turned on according to the emission control signal EM received via the emission control line EL, and thus, the driving current Ioled may flow in the organic light-emitting diode OLED.

The seventh transistor T7 (or second initialization transistor) may be connected between the organic light-emitting diode OLED and the initialization voltage line VIL. The seventh transistor T7 may include a gate electrode connected to the third scan line SL3, a first terminal connected to the second terminal of the sixth transistor T6 and the pixel electrode of the organic light-emitting diode OLED, and a second terminal connected to the initialization voltage line VIL. The seventh transistor T7 may be turned on according to the third scan signal GB received via the third scan line SL3 to initialize the pixel electrode of the organic light-emitting diode OLED by transmitting the initialization voltage VINT to the pixel electrode of the organic light-emitting diode OLED.

A capacitor Cst may include a first electrode connected to the gate electrode of the first transistor T1 and a second electrode connected to the driving voltage line PL. The capacitor Cst may maintain a voltage applied to the gate electrode of the first transistor T1 by storing and maintaining a voltage corresponding to a voltage difference between the driving voltage line PL and the gate electrode of the first transistor T1.

The organic light-emitting diode OLED may include a pixel electrode (a first electrode or an anode) and an opposite electrode (a second electrode or a cathode), and the opposite electrode may receive a common voltage ELVSS. The organic light-emitting diode OLED may receive the driving current Ioled from the first transistor T1 and emit light, thereby displaying an image.

In FIG. 5, the first to seventh transistors T1 to T7 are shown as P-type transistors. However, the disclosure is not limited thereto. In an embodiment, the first to seventh transistors T1 to T7 may be N-type transistors, for example. In an alternative embodiment, some of the first to seventh transistors T1 to T7 may be N-type transistors, and the remaining transistors may be P-type transistors. In an embodiment, among the first to seventh transistors T1 to T7, the third transistor T3 and the fourth transistor T4 may be N-type transistors, and the remaining transistors may be P-type transistors, for example. In this regard, the third transistor T3 and the fourth transistor T4 may each include a semiconductor layer including oxide, and the remaining transistors may each include a semiconductor layer including silicon.

In the illustrated embodiment, an organic light-emitting diode is used as a display element. However, in another embodiment, an inorganic light-emitting element or a quantum dot light-emitting element may be used as the display element.

Figure 6:
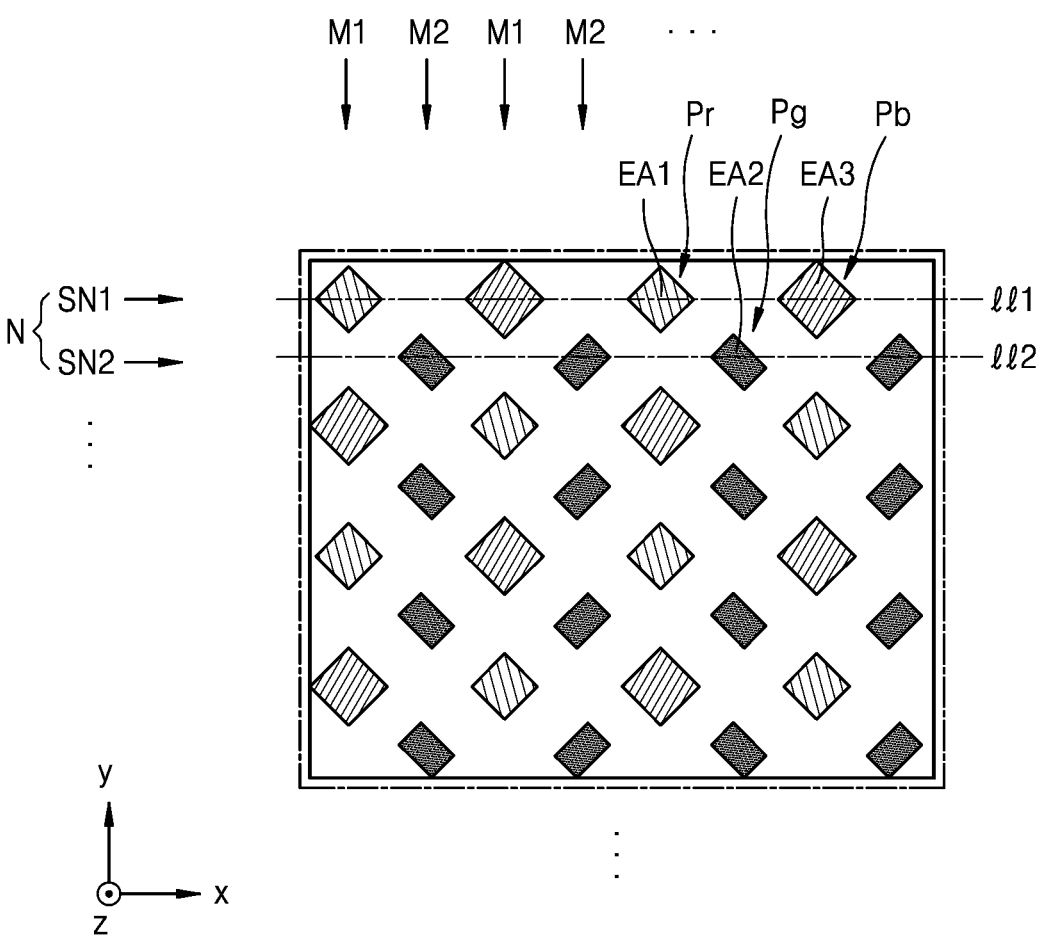
FIG. 6 is a diagram illustrating an embodiment of a schematic arrangement of emission areas of a plurality of pixels arranged in a display area.

FIG. 6 is a diagram illustrating an embodiment of a schematic arrangement of emission areas of a plurality of pixels arranged in a display area.

Referring to FIG. 6, the plurality of pixels arranged in the display area DA may include a first sub-pixel Pr emitting light of a first color, a second sub-pixel Pg emitting light of a second color, and a third sub-pixel Pb emitting light of a third color. In an embodiment, the first sub-pixel Pr may be a red pixel emitting red light, the second sub-pixel Pg may be a green pixel emitting green light, and the third sub-pixel Pb may be a blue pixel emitting blue light.

In the first display area DA1 and the second display area DA2, the first sub-pixel Pr, the second sub-pixel Pg, and the third sub-pixel Pb may be repeatedly arranged according to a predetermined pattern in a ±x direction and a ±y direction. Each of the first sub-pixel Pr, the second sub-pixel Pg, and the third sub-pixel Pb may include a pixel circuit and a display element electrically connected to the pixel circuit. In an embodiment, the display element may be the organic light-emitting diode OLED.

An emission area of each of the first sub-pixel Pr, the second sub-pixel Pg, and the third sub-pixel Pb is an area in which an emission layer of the organic light-emitting diode OLED is disposed. The emission area may be defined by an opening of a pixel-defining layer.

In a first column M1, a first emission area EA1 of the first sub-pixel Pr and a third emission area EA3 of the third sub-pixel Pb may be alternately arranged in the ±y direction. In a second column M2, a second emission area EA2 of the second sub-pixel Pg may be repeatedly arranged in the ±y direction. The first column M1 and the second column M2 may alternate in the ±x direction, and an adjacent pair of first columns M1 may have opposite arrangements of the first emission area EA1 of the first sub-pixel Pr and the third emission area EA3 of the third sub-pixel Pb.

In a first sub-row SN1 of each row N, the first emission area EA1 of the first sub-pixel Pr and the third emission area EA3 of the third sub-pixel Pb may be alternately arranged along a first virtual line $\ell 1$ in the ±x direction. In a second sub-row SN2 of each row N, the second emission area EA2 of the second sub-pixel Pg may be repeatedly arranged along a second virtual line $\ell 2$ in the ±x direction. That is, in each row N, the first emission area EA1 of the first sub-pixel Pr, the second emission area EA2 of the second sub-pixel Pg, the third emission area EA3 of the third sub-pixel Pb, and the second emission area EA2 of the second sub-pixel Pg may be repeatedly arranged in a zigzag pattern.

The first emission area EA1 of the first sub-pixel Pr, the second emission area EA2 of the second sub-pixel Pg, and the third emission area EA3 of the third sub-pixel Pb may have different area sizes from each other. In an embodiment, the third emission area EA3 of the third sub-pixel Pb may have a larger area size than an area size of the first emission area EA1 of the first sub-pixel Pr. In addition, the third emission area EA3 of the third sub-pixel Pb may have a larger area size than an area size of the second emission area EA2 of the second sub-pixel Pg. The first emission area EA1 of the first sub-pixel Pr may have a larger area size than an area size of the second emission area EA2 of the second sub-pixel Pg. In another embodiment, the third emission area EA3 of the third sub-pixel Pb may have the same area as the first emission area EA1 of the first sub-pixel Pr. However, the disclosure is not limited thereto. Various embodiments are possible, e.g., the first emission area EA1 of the first sub-pixel Pr may be larger than the second emission area EA2 of the second sub-pixel Pg and the third emission area EA3 of the third sub-pixel Pb.

The first to third emission areas EA1, EA2, and EA3 may each have a polygonal shape, such as a quadrangle or an octagon, a circular shape, or an oval shape, and the polygonal shape may include a shape having round corners (or vertices).

Figure 7:
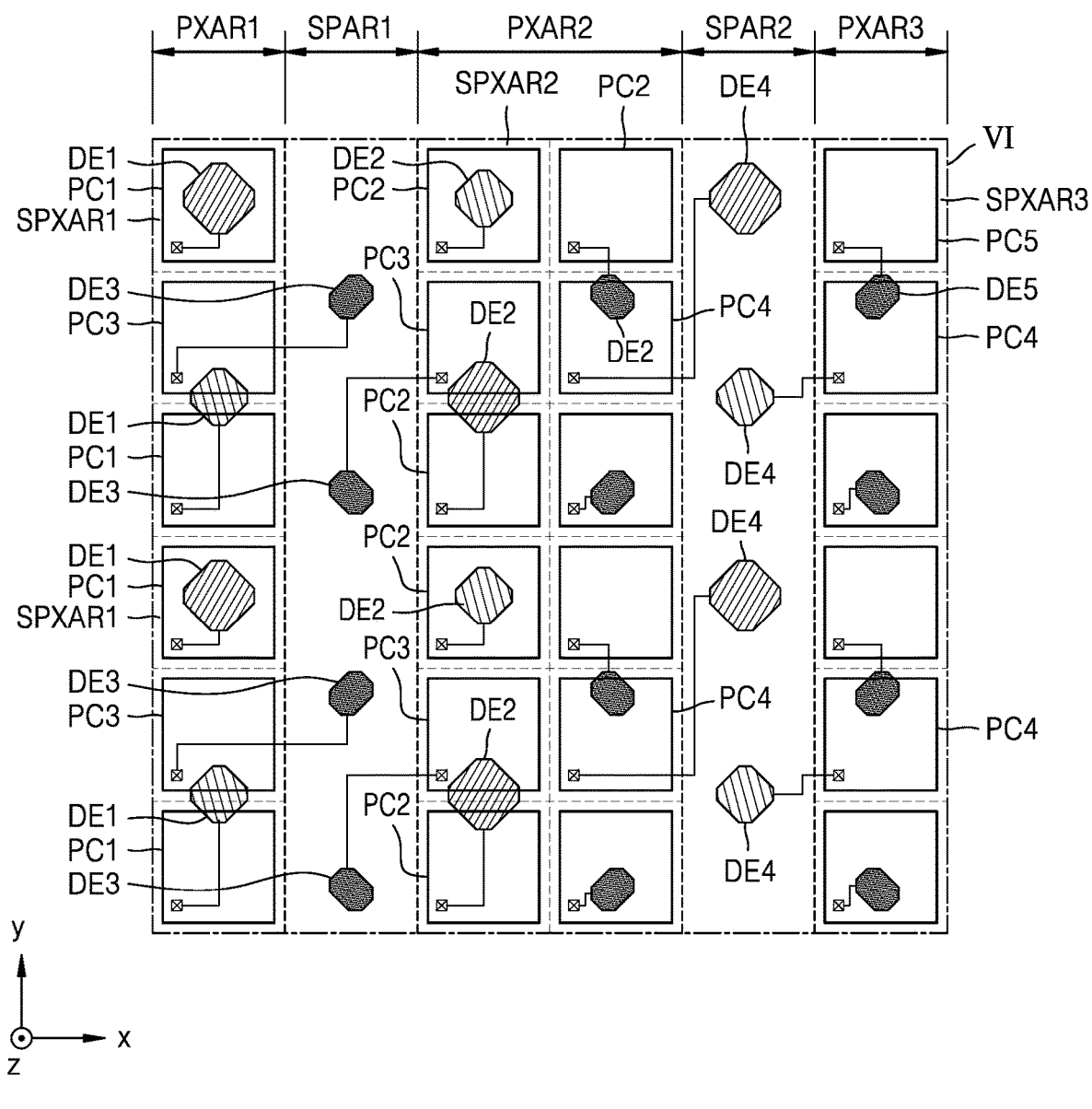
FIG. 7 is an enlarged plan view illustrating a region VI of FIG. 3.

FIG. 7 is an enlarged plan view illustrating a region VI of FIG. 3. FIG. 7 is a diagram illustrating an embodiment of a connection between a pixel circuit and a display element in a display area. Although FIG. 7 is described with respect to the first non-folding area NFA1, the description of FIG. 7 may be equally applied to the first folding area FA1, the second folding area FA2, the second non-folding area NFA2, and the third non-folding area NFA3.

Referring to FIG. 7, the first non-folding area NFA1 of the display apparatus 1 may include pixel areas and separation areas that are alternately arranged in a first direction (e.g., the ±x direction). In an embodiment, a first separation area SPAR1 may be disposed between a first pixel area PXAR1 and a second pixel area PXAR2 that are apart from each other, for example. A second separation area SPAR2 may be disposed between the second pixel area PXAR2 and a third pixel area PXAR3 that are apart from each other.

Each of pixel areas may include sub-pixel areas. In an embodiment, the first pixel area PXAR1 may include first sub-pixel areas SPXAR1, the second pixel area PXAR2 may include second sub-pixel areas SPXAR2, and the third pixel area PXAR3 may include third sub-pixel areas SPXAR3, for example. The first sub-pixel areas SPXAR1, the second sub-pixel areas SPXAR2, and the third sub-pixel areas SPXAR3 may be arranged in the first direction (e.g., the ±x direction) and/or a second direction (e.g., the ±y direction).

A length direction of each of pixel areas and separation areas may be parallel to a folding axis of a folding area. Referring to FIG. 3 described above, the first folding axis FAX1 of the first folding area FA1 and the second folding axis FAX2 of the second folding area FA2 may extend in the second direction (e.g., the ±y direction). The length direction of each of the pixel areas and separation areas may be the second direction (e.g., the ±y direction).

Pixel circuits may be arranged in sub-pixel areas. In an embodiment, first pixel circuits PC1 may be respectively arranged in some first sub-pixel areas SPXAR1 among the plurality of first sub-pixel areas SPXAR1, for example. Second pixel circuits PC2 may be respectively arranged in some second sub-pixel areas SPXAR2 among the plurality of second sub-pixel areas SPXAR2. Third pixel circuits PC3 may be respectively arranged in some other first sub-pixel areas SPXAR1 among the plurality of first sub-pixel areas SPXAR1 and some other second sub-pixel areas SPXAR2 among the plurality of second sub-pixel areas SPXAR2. Fifth pixel circuits PC5 may be respectively arranged in some third sub-pixel areas SPXAR3 among the plurality of third sub-pixel areas SPXAR3. Fourth pixel circuits PC4 may be respectively arranged in yet some other second sub-pixel areas SPXAR2 among the plurality of second sub-pixel areas SPXAR2 and some other third sub-pixel areas SPXAR3 among the plurality of third sub-pixel areas SPXAR3.

In an embodiment, two first pixel circuits PC1 may be arranged between adjacent third pixel circuits PC3 arranged in the first pixel area PXAR1, among the plurality of third pixel circuits PC3. Two second pixel circuits PC2 may be arranged between adjacent third pixel circuits PC3 arranged in the second pixel area PXAR2, among the plurality of third pixel circuits PC3. Two second pixel circuits PC2 may be arranged between adjacent fourth pixel circuits PC4 arranged in the second pixel area PXAR2, among the plurality of fourth pixel circuits PC4. Two fifth pixel circuits PC5 may be arranged between adjacent fourth pixel circuits PC4 arranged in the third pixel area PXAR3, among the plurality of fourth pixel circuits PC4.

In an embodiment, the first pixel circuits PC1, the second pixel circuits PC2, and the fifth pixel circuits PC5 may be arranged in the same row (or column). The third pixel circuits PC3 and the fourth pixel circuits PC4 may be arranged in the same row (or column). Such an arrangement of pixel circuits is only one of embodiments, and the arrangement of pixel circuits may be variously modified in each pixel area.

No pixel circuit may be disposed in separation areas. As described below with reference to FIG. 8, pillars may be arranged in the separation areas. When separation areas, in which pillars are arranged, are present between pixel areas, an external impact from outside the display apparatus 1 may be distributed to the pillars and thus be prevented from reaching only pixel circuits arranged in the pixel areas. The pixel circuits may be protected from the external impact.

A display element may be disposed above a pixel circuit. The display element may be disposed directly above a pixel circuit connected thereto to overlap the same, or may be offset from the pixel circuit to partially overlap a pixel circuit of another pixel disposed in an adjacent row and/or column. In an alternative embodiment, the display element may not overlap the pixel circuit connected thereto. In an embodiment, first display elements DE1 may be arranged in the first pixel area PXAR1, and second display elements DE2 may be arranged in the second pixel area PXAR2, for example. Third display elements DE3 may be arranged in the first separation area SPAR1, and fourth display elements DE4 may be arranged in the second separation area SPAR2. Fifth display elements DE5 may be arranged in the third pixel area PXAR3.

The first display elements DE1 may be electrically and respectively connected to the first pixel circuits PC1 arranged in the first pixel area PXAR1. The first display element DE1 may be disposed directly above the first pixel circuit PC1 connected thereto to overlap the same, or may be offset from the first pixel circuit PC1 connected thereto to at least partially overlap the third pixel circuit PC3 disposed in an adjacent row and/or column. The second display elements DE2 may be electrically and respectively connected to the second pixel circuits PC2 arranged in the second pixel area PXAR2. The second display element DE2 may be disposed directly above the second pixel circuit PC2 connected thereto to overlap the same, or may be offset from the second pixel circuit PC2 connected thereto to at least partially overlap the third pixel circuit PC3 or the fourth pixel circuit PC4 disposed in an adjacent row and/or column. The third display elements DE3 may be electrically and respectively connected to the third pixel circuits PC3 arranged in the first pixel area PXAR1 and the second pixel area PXAR2. The third display element DE3 may not overlap the third pixel circuit PC3 connected thereto. The fourth display elements DE4 may be electrically and respectively connected to the fourth pixel circuits PC4 arranged in the second pixel area PXAR2 and the third pixel area PXAR3. The fourth display element DE4 may not overlap the fourth pixel circuit PC4 connected thereto. The fifth display elements DE5 may be electrically and respectively connected to the fifth pixel circuits PC5 arranged in the third pixel area PXAR3. The fifth display element DE5 may be disposed directly above the fifth pixel circuit PC5 connected thereto to overlap the same, or may be offset from the fifth pixel circuit PC5 connected thereto to at least partially overlap the fourth pixel circuit PC4 disposed in an adjacent row and/or column.

FIG. 8 is an enlarged plan view illustrating the region VI of FIG. 3. FIG. 8 is a diagram illustrating an embodiment of an insulating layer and a pixel isolation layer in a display area. Although FIG. 8 is described with respect to the first non-folding area NFA1, the description of FIG. 8 may be equally applied to the first folding area FA1, the second folding area FA2, the second non-folding area NFA2, and the third non-folding area NFA3. The same reference numerals in FIGS. 7 and 8 denote the same elements, and thus, redundant descriptions thereof are omitted.

Referring to FIG. 8, the display apparatus 1 may include a first insulating layer IIL1, a second insulating layer IIL2, a third insulating layer IIL3, a first pixel isolation layer PSL1, a second pixel isolation layer PSL2, a third pixel isolation layer PSL3, a first pillar PR1, a second pillar PR2, the data line DL, the driving voltage line PL, and a connection line CL.

A first trench ttr1, a second trench ttr2, a first auxiliary trench str1, a second auxiliary trench str2, and a third auxiliary trench str3 may be defined in the first insulating layer IIL1. The first trench ttr1 may correspond to the first separation area SPAR1, and the second trench ttr2 may correspond to the second separation area SPAR2. The first auxiliary trenches str1 may respectively correspond to boundaries of the first sub-pixel areas SPXAR1, the second auxiliary trenches str2 may respectively correspond to boundaries of the second sub-pixel areas SPXAR2, and the third auxiliary trenches str3 may respectively correspond to boundaries of the third sub-pixel areas SPXAR3.

The second insulating layer IIL2 may be buried in the first trench ttr1, and the third insulating layer IIL3 may be buried in the second trench ttr2. The first pixel isolation layers PSL1 may be respectively buried in the first auxiliary trenches str1, the second pixel isolation layers PSL2 may be respectively buried in the second auxiliary trenches str2, and the third pixel isolation layers PSL3 may be respectively buried in the third auxiliary trenches str3.

Although FIG. 8 shows that a pixel area is entirely surrounded by pixel isolation layers and an insulating layer, in another embodiment, a pixel area may be partially surrounded by pixel isolation layers and an insulating layer.

In an embodiment, the second insulating layer IIL2, the third insulating layer IIL3, the first pixel isolation layer PSL1, the second pixel isolation layer PSL2, and the third pixel isolation layer PSL3 may each include a material different from that of the first insulating layer IIL1. In an embodiment, the first insulating layer IIL1 may include an inorganic material, and the second insulating layer IIL2, the third insulating layer IIL3, the first pixel isolation layer PSL1, the second pixel isolation layer PSL2, and the third pixel isolation layer PSL3 may each include an organic material, for example. Because the second insulating layer IIL2, the third insulating layer IIL3, the first pixel isolation layer PSL1, the second pixel isolation layer PSL2, and the third pixel isolation layer PSL3 each include an organic material, in the case of an external impact, a crack formed in the first insulating layer IIL1 including an inorganic material in one pixel may be effectively prevented or reduced from growing into an adjacent pixel.

Figure 9:
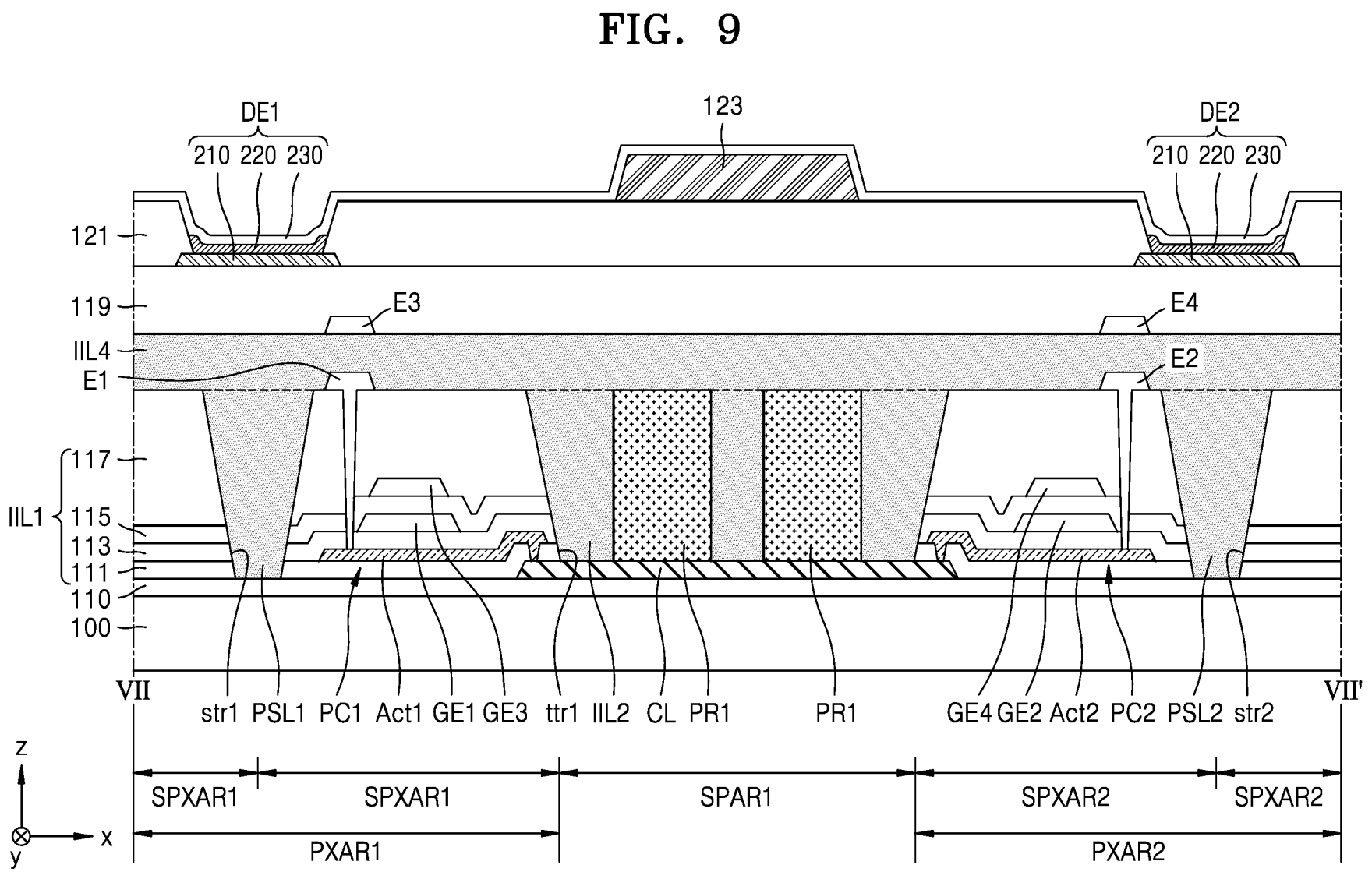

The first pillars PR1 may be arranged apart from each other in the first separation area SPAR1. Although FIG. 8 shows that the first pillars PR1 are arranged in two rows, in another embodiment, the first pillars PR1 may be arranged in one row or three or more rows. As shown in FIG. 9 described below, the first pillars PR1 may be arranged in the first trench ttr1 of the first insulating layer IIL1 formed in the first separation area SPAR1. The first pillars PR1 may be at least partially surrounded by the second insulating layer IIL2.

In an embodiment, a modulus of the first pillar PR1 and a modulus of the second insulating layer IIL2 may be different from each other. In an embodiment, the modulus of the first pillar PR1 may be greater than the modulus of the second insulating layer IIL2, for example. The first pillar PR1 may include a high-hardness material. In an embodiment, the first pillar PR1 may have a single-layered or multi-layered structure including an inorganic material, for example. The first pillar PR1 may include $SiO_2$, $SiN_x$, $SiON$, $Al_2O_3$, $TiO_2$, $Ta_2O_5$, $HfO_2$, or $ZnO_2$. In an alternative embodiment, the first pillar PR1 may include a conductive material including Mo, Al, Cu, or Ti, etc., and may be a multi-layer or a single layer including the above-described materials.

In an embodiment, a planar shape of the first pillar PR1 may be a hexagon. The first pillar PR1 may be a hexagonal prism. Because the second insulating layer IIL2 at least partially surrounds the first pillars PR1 each having a hexagonal planar shape, the second insulating layer IIL2 may have a honeycomb structure in a plan view.

When the first pillars PR1 each including a high-hardness material are arranged in the first trench ttr1, an external impact from outside the display apparatus may be prevented from reaching only pixel circuits that are arranged in the first pixel area PXAR1 and the second pixel area PXAR2 to drive display elements. The external impact may be distributed to the first pillars PR1, and the pixel circuits may be protected.

The second pillars PR2 may be arranged apart from each other in the second separation area SPAR2. Although FIG. 8 shows that the second pillars PR2 are arranged in two rows, in another embodiment, the second pillars PR2 may be arranged in one row or three or more rows. The second pillars PR2 may be arranged in the second trench ttr2 of the first insulating layer IIL1 formed in the second separation area SPAR2. The second pillars PR2 may be at least partially surrounded by the third insulating layer IIL3.

In an embodiment, a modulus of the second pillar PR2 and a modulus of the third insulating layer IIL3 may be different from each other. In an embodiment, the modulus of the second pillar PR2 may be greater than the modulus of the third insulating layer IIL3. The second pillar PR2 may include a high-hardness material, for example. In an embodiment, the second pillar PR2 may have a single-layered or multi-layered structure including an inorganic material, for example. The second pillar PR2 may include $SiO_2$, $SiN_x$, SiON, $Al_2O_3$, $TiO_2$, $Ta_2O_5$, $HfO_2$, or $ZnO_2$. In an alternative embodiment, the second pillar PR2 may include a conductive material including Mo, Al, Cu, or Ti, etc., and may be a multi-layer or a single layer including the above-described materials.

In an embodiment, a planar shape of the second pillar PR2 may be a hexagon. The second pillar PR2 may be a hexagonal prism. Because the third insulating layer IIL3 at least partially surrounds the second pillars PR2 each having a hexagonal planar shape, the third insulating layer IIL3 may have a honeycomb structure in a plan view.

When the second pillars PR2 each including a high-hardness material are arranged in the second trench ttr2, an external impact from outside the display apparatus may be prevented from reaching only pixel circuits that are arranged in the second pixel area PXAR2 and the third pixel area PXAR3 to drive display elements. The external impact may be distributed to the second pillars PR2, and the pixel circuits may be protected.

Figure 10:
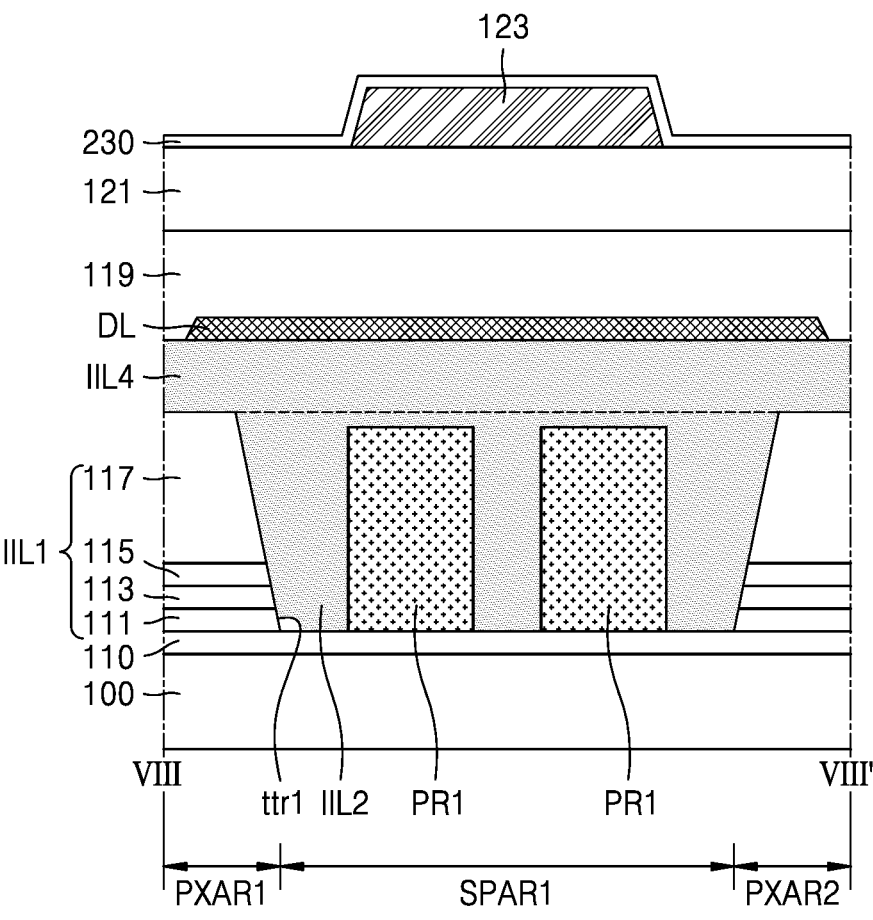
FIG. 10 is a cross-sectional view illustrating a portion of the display apparatus of FIG. 8, taken along line VIII-VIII'.

The data line DL may at least partially overlap the first separation area SPAR1. The data line DL may extend in the first direction (e.g., the ±x direction) to transmit data signals to a pixel circuit disposed in the first pixel area PXAR1 and a pixel circuit disposed in the second pixel area PXAR2. As shown in FIG. 10 described below, the data line DL may be disposed above the first insulating layer IIL1 and the second insulating layer IIL2. Although the data line DL has been described with respect to the first separation area SPAR1, the description of the data line DL may be equally applied to the second separation area SPAR2.

The driving voltage line PL may at least partially overlap the first separation area SPAR1. The driving voltage line PL may extend in the first direction (e.g., the ±x direction) to transmit driving voltages to a pixel circuit disposed in the first pixel area PXAR1 and a pixel circuit disposed in the second pixel area PXAR2. The driving voltage line PL may be disposed above the first insulating layer IIL1 and the second insulating layer IIL2. Although the driving voltage line PL has been described with respect to the first separation area SPAR1, the description of the driving voltage line PL may be equally applied to the second separation area SPAR2.

Although FIG. 8 shows that the data lines DL and the driving voltage lines PL respectively correspond to separation areas, in another embodiment, one data line DL and one driving voltage line PL may extend in the first direction (e.g., the ±x direction) to overlap a plurality of pixel areas and a plurality of separation areas.

The connection line CL may at least partially overlap the first separation area SPAR1. As shown in FIG. 9 described below, the connection line CL may extend in the first direction (e.g., the ±x direction) to connect a semiconductor layer disposed in the first pixel area PXAR1 to a semiconductor layer disposed in the second pixel area PXAR2. The connection line CL may be disposed between a semiconductor layer and the substrate 100. Although the connection line CL has been described with respect to the first separation area SPAR1, the description of the connection line CL may be equally applied to the second separation area SPAR2.

FIG. 9 is a cross-sectional view taken along line VII-VII', illustrating a portion of the display apparatus of FIG. 8. Although FIG. 9 is described with respect to the first pixel area PXAR1, the first separation area SPAR1, and the second pixel area PXAR2, the description of FIG. 9 may be equally applied to the second separation area SPAR2 and the third pixel area PXAR3.

Referring to FIG. 9, the first pixel area PXAR1, the second pixel area PXAR2, and the first separation area SPAR1 may be defined in the substrate 100, the first pixel area PXAR1 and the second pixel area PXAR2 may be apart from each other, and the first separation area SPAR1 may be between the first pixel area PXAR1 and the second pixel area PXAR2. The first pixel area PXAR1 may include the first sub-pixel areas SPXAR1, and the second pixel area PXAR2 may include the second sub-pixel areas SPXAR2.

The first insulating layer IIL1 disposed above the substrate 100 may include a buffer layer 111, a first gate insulating layer 113, a second gate insulating layer 115, and an inter-insulating layer 117. The first auxiliary trench str1 corresponding to boundaries of the first sub-pixel areas SPXAR1, the first trench ttr1 corresponding to the first separation area SPAR1, and the second auxiliary trench str2 corresponding to boundaries of the second sub-pixel areas SPXAR2 may be defined in the first insulating layer IIL1.

The first pixel isolation layer PSL1 may be buried in the first auxiliary trench str1, the second pixel isolation layer PSL2 may be buried in the second auxiliary trench str2, and the second insulating layer IIL2 may be buried in the first trench ttr1. The first pillars PR1 may be arranged in the first trench ttr1, and may be at least partially surrounded by the second insulating layer IIL2.

The first pixel circuit PC1 may be disposed in the first sub-pixel area SPXAR1, and the second pixel circuit PC2 may be disposed in the second sub-pixel area SPXAR2. The first pixel circuit PC1 may include a first semiconductor layer Act1, a first gate electrode GE1, and a third gate electrode GE3, and the second pixel circuit PC2 may include a second semiconductor layer Act2, a second gate electrode GE2, and a fourth gate electrode GE4. The first semiconductor layer Act1 and the second semiconductor layer Act2 may be arranged in the same layer, the first gate electrode GE1 and the second gate electrode GE2 may be arranged in the same layer, and the third gate electrode GE3 and the fourth gate electrode GE4 may be arranged in the same layer.

The connection line CL may at least partially overlap the first separation area SPAR1. The connection line CL may be disposed between the first semiconductor layer Act1 and the substrate 100. The connection line CL may extend in the first direction (e.g., the ±x direction) to connect the first semiconductor layer Act1 to the second semiconductor layer Act2. The first semiconductor layer Act1 may be connected to the connection line CL via a contact hole defined in the buffer layer 111, and the second semiconductor layer Act2 may be connected to the connection line CL via another contact hole defined in the buffer layer 111.

FIG. 9 shows that the first pixel circuit PC1 is disposed in the first sub-pixel area SPXAR1 and the second pixel circuit PC2 is disposed in the second sub-pixel area SPXAR2. However, as described above with reference to FIG. 7, the third pixel circuit PC3 may be disposed in the first sub-pixel area SPXAR1 and the second sub-pixel area SPXAR2, and thus, the description of FIG. 9 may be equally applied to the third pixel circuit PC3.

Hereinafter, elements included in the display apparatus 1 will be described in more detail according to a stacked structure with reference to FIG. 9.

The substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the above-described polymer resin and an inorganic layer (not shown).

The barrier layer 110 may be disposed on the substrate 100. The barrier layer 110 may prevent or reduce penetration of impurities from the substrate 100, etc., into a first semiconductor layer Act1 and a second semiconductor layer Act2. The barrier layer 110 may include an inorganic material, such as oxide or nitride, an organic material, or an organic-inorganic composite material, and may have a single-layered or multi-layered structure including an inorganic material and an organic material.

The buffer layer 111 may be disposed on the barrier layer 110. The buffer layer 111 may reduce or prevent penetration of foreign materials, moisture, or external air from below the substrate 100, and may provide a flat surface on the substrate 100. The buffer layer 111 may include an inorganic material, such as oxide or nitride, an organic material, or an organic-inorganic composite material, and may have a single-layered or multi-layered structure including an inorganic material and an organic material.

The first insulating layer IIL1 may be disposed on the buffer layer 111. The first insulating layer IIL1 may include $SiO_2$, $SiN_x$, SiON, $Al_2O_3$, $TiO_2$, $Ta_2O_5$, $HfO_2$, or $ZnO_2$.

The first pixel isolation layer PSL1 disposed in the first auxiliary trench str1 of the first insulating layer IIL1, the second pixel isolation layer PSL2 disposed in the second auxiliary trench str2 of the first insulating layer IIL1, and the second insulating layer IIL2 disposed in the first trench ttr1 of the first insulating layer IIL1 may each be a single layer or a multi-layer including an organic material. In an embodiment, the first pixel isolation layer PSL1, the second pixel isolation layer PSL2, and the second insulating layer IIL2 may each include a general-purpose polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof, for example.

The first pillars PR1 may be arranged in the first trench ttr1 of the first insulating layer IIL1. The first pillars PR1 may each include a high-hardness material. In an embodiment, the first pillars PR1 may each have a single-layered or multi-layered structure including an inorganic material, for example. The first pillars PR1 may each include $SiO_2$, $SiN_x$, SiON, $Al_2O_3$, $TiO_2$, $Ta_2O_5$, $HfO_2$, or $ZnO_2$. In an alternative embodiment, the first pillars PR1 may each include a conductive material including Mo, Al, Cu, or Ti, etc., and may each be a multi-layer or a single layer including the above-described materials. When the first pillars PR1 each include the conductive material, at least one insulating layer may be disposed between the first pillars PR1 and the connection line CL.

The connection line CL may be disposed between the barrier layer 110 and the buffer layer 111. The connection line CL may include a conductive material including Mo, Al, Cu, or Ti, etc., and may be a multi-layer or a single layer including the above-described materials. In an embodiment, the connection line CL may be a single layer including Mo.

The first semiconductor layer Act1 and the second semiconductor layer Act2 may be disposed on the buffer layer 111, for example. The first semiconductor layer Act1 and the second semiconductor layer Act2 may each include amorphous silicon or polysilicon. In another embodiment, the first semiconductor layer Act1 and the second semiconductor layer Act2 may each include at least one material of indium (In), gallium (Ga), tin (Sn), zirconium (Zr), vanadium (V), hafnium (Hf), cadmium (Cd), germanium (Ge), chromium (Cr), Ti, Al, cesium (Cs), cerium (Ce), and zinc (Zn).

The first semiconductor layer Act1 and second semiconductor layer Act2 may each include a channel area, and a source area and a drain area respectively arranged on opposite sides of the channel area. The first semiconductor layer Act1 and the second semiconductor layer Act2 may each be a single layer or a multi-layer.

The first gate insulating layer 113 may be disposed on the buffer layer 111 to cover the first semiconductor layer Act1 and the second semiconductor layer Act2. The first gate electrode GE1 and the second gate electrode GE2 may be disposed on the first gate insulating layer 113. The first gate electrode GE1 and the second gate electrode GE2 may each include a conductive material including Mo, Al, Cu, or Ti, etc., and may each be a multi-layer or a single layer including the above-described materials. In an embodiment, the first gate electrode GE1 and the second gate electrode GE2 may each be a single layer including Mo, for example.

The second gate insulating layer 115 may be disposed on the first gate insulating layer 113 to cover the first gate electrode GE1 and the second gate electrode GE2. The third gate electrode GE3 and the fourth gate electrode GE4 may be disposed on the second gate insulating layer 115. The third gate electrode GE3 and the fourth gate electrode GE4 may each include a conductive material including Mo, Al, Cu, or Ti, etc., and may each be a multi-layer or a single layer including the above-described materials. In an embodiment, the third gate electrode GE3 and the fourth gate electrode GE4 may each be a single layer including Mo, for example.

The inter-insulating layer 117 may be disposed on the second gate insulating layer 115 to cover the third gate electrode GE3 and the fourth gate electrode GE4. A first electrode E1 and a second electrode E2 may be disposed on the inter-insulating layer 117. The first electrode E1 may be connected to the first semiconductor layer Act1 via at least one contact hole defined in the first gate insulating layer 113, the second gate insulating layer 115, and the inter-insulating layer 117. The second electrode E2 may be connected to the second semiconductor layer Act2 via at least one contact hole defined in the first gate insulating layer 113, the second gate insulating layer 115, and the inter-insulating layer 117. The first electrode E1 and the second electrode E2 may each include a conductive material including Mo, Al, Cu, or Ti, etc., and may each be a multi-layer or a single layer including the above-described materials. In an embodiment, the first electrode E1 and the second electrode E2 may each have a multi-layered structure of Ti/Al/Ti, for example.

A fourth insulating layer IIL4 may be disposed on the inter-insulating layer 117 to cover the first electrode E1 and the second electrode E2. The fourth insulating layer IIL4 may be a single layer or a multi-layer including an organic material, and may provide a flat upper surface. The fourth insulating layer IIL4 may include a general-purpose polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

A third electrode E3 and a fourth electrode E4 may be disposed on the fourth insulating layer IIL4. The third electrode E3 and the fourth electrode E4 may each include a conductive material including Mo, Al, Cu, or Ti, etc., and may each be a multi-layer or a single layer including the above-described materials. In an embodiment, the third electrode E3 and the fourth electrode E4 may each have a multi-layered structure of Ti/Al/Ti, for example.

A fifth insulating layer 119 may be disposed on the fourth insulating layer IIL4 to cover the third electrode E3 and the fourth electrode E4. The fifth insulating layer 119 may be a single layer or a multi-layer including an organic material, and may provide a flat upper surface. The fifth insulating layer 119 may include a general-purpose polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

The first display element DE1 and the second display element DE2 may be disposed on the fifth insulating layer 119. The first display element DE1 and the second display element DE2 may be organic light-emitting diodes. Each of the first display element DE1 and the second display element DE2 may include the pixel electrode 210, the intermediate layer 220 including an organic emission layer, and the opposite electrode 230. Although not shown in FIG. 9, each of the first display element DE1 and the second display element DE2 may be connected to a pixel circuit via at least one contact hole defined in the fifth insulating layer 119, etc.

The pixel electrode 210 may be a (semi-)transmissive electrode or a reflective electrode. In some embodiments, the pixel electrode 210 may include a reflective layer including Ag, Mg, Al, Pt, Pd, Au, Ni, Nd, Ir, Cr, or any combinations thereof, and a transparent or semi-transparent electrode layer formed on the reflective layer. The transparent or semi-transparent electrode layer may include at least one of ITO, IZO, ZnO, $In_2O_3$, IGO, and AZO. In some embodiments, the pixel electrode 210 may include ITO/Ag/ITO.

A pixel-defining layer 121 may be disposed on the fifth insulating layer 119 in a display area of the substrate 100. The pixel-defining layer 121 may cover an edge of the pixel electrode 210, and an opening exposing a central portion of the pixel electrode 210 may be defined in the pixel-defining layer 121. An emission area of each of the first display element DE1 and the second display element DE2 may be defined by the opening.

The pixel-defining layer 121 may prevent an arc, etc., from occurring on the edge of the pixel electrode 210 by increasing a distance between the edge of the pixel electrode 210 and the opposite electrode 230 above the pixel electrode 210.

The pixel-defining layer 121 may include at least one organic insulating material of polyimide, polyamide, acrylic resin, BCB, and phenolic resin, and may be formed by spin coating, etc. The pixel-defining layer 121 may include an organic insulating material. In an alternative embodiment, the pixel-defining layer 121 may include an inorganic insulating material, such as $SiN_x$, SiON, or $SiO_2$. In an alternative embodiment, the pixel-defining layer 121 may include an organic insulating material and an inorganic insulating material. In some embodiments, the pixel-defining layer 121 may include a light-blocking material, and may have a black color. The light-blocking material may include carbon black, carbon nanotubes, resin or paste including black dye, metal particles (e.g., Ni, Al, Mo, or any alloys thereof), metal oxide particles (e.g., chromium oxide), or metal nitride particles (e.g., chromium nitride). When the pixel-defining layer 121 includes the light-blocking material, reflection of external light due to metal structures arranged below the pixel-defining layer 121 may be reduced.

A spacer 123 may be disposed on the pixel-defining layer 121. The spacer 123 may be disposed in the first separation area SPAR1. The spacer 123 may at least partially overlap the first pillars PR1. When the spacer 123 at least partially overlaps the first pillars PR1, an external impact may be distributed to the spacer 123, and the strength of the display apparatus may be further improved.

The spacer 123 may be provided to prevent damage to the substrate 100 in a method of manufacturing a display apparatus. A mask sheet may be used when manufacturing a display apparatus. In this case, when the mask sheet enters the opening of the pixel-defining layer 121 or is brought into close contact with the pixel-defining layer 121 to deposit a deposition material on the substrate 100, a defect in which a portion of the substrate 100 is damaged or broken by the mask sheet may be prevented. The spacer 123 may include an organic insulating material, such as polyimide. In an alternative embodiment, the spacer 123 may include an inorganic insulating material, such as $SiN_x$ or $SiO_2$, or may include an organic insulating material and an inorganic insulating material.

In an embodiment, the spacer 123 may include a material different from that of the pixel-defining layer 121. In an alternative embodiment, in another embodiment, the spacer 123 may include the same material as that of the pixel-defining layer 121. In this case, the pixel-defining layer 121 and the spacer 123 may be formed together in a mask process using a halftone mask, etc. The pixel-defining layer 121 and the spacer 123 may be unitary as a single body.

The intermediate layer 220 may be disposed in the opening defined by the pixel-defining layer 121, and may include an organic emission layer. The organic emission layer may include an organic material including a fluorescent or phosphorescent material emitting red, green, blue, or white light. The organic emission layer may include a low-molecular weight organic material or a high-molecular weight organic material. A functional layer, such as a HTL, a HIL, an ETL, or an EIL, may be optionally further disposed below and above the organic emission layer.

The opposite electrode 230 may be a transmissive electrode or a reflective electrode. In some embodiments, the opposite electrode 230 may be a transparent or semi-transparent electrode, and may include a metal thin film having a substantially small work function, including Li, Ca, LiF/Ca, LiF/Al, Al, Ag, Mg, or any combinations thereof. In addition, a TCO layer, such as ITO, IZO, ZnO, or $In_2O_3$, may be further disposed on the metal thin film. The opposite electrode 230 may be disposed over a display area, and may be disposed on the intermediate layer 220 and the pixel-defining layer 121. The opposite electrode 230 may be unitary as a single body in the first display element DE1 and the second display element DE2 to correspond to the pixel electrodes 210.

Because the first display element DE1 and the second display element DE2 may be easily damaged by external moisture or oxygen, an encapsulation layer (not shown) may cover and protect the first display element DE1 and the second display element DE2. The encapsulation layer may cover the display area, and may extend to at least a portion of a peripheral area. The encapsulation layer may include a first inorganic encapsulation layer, an organic encapsulation layer, and a second inorganic encapsulation layer.

FIG. 10 is a cross-sectional view illustrating a portion of the display apparatus of FIG. 8, taken along line VIII-VIII'. The same reference numerals in FIGS. 9 and 10 denote the same elements, and thus, redundant descriptions thereof are omitted.

Referring to FIG. 10, the data line DL may be disposed on the fourth insulating layer IIL4. The data line DL may at least partially overlap the first separation area SPAR1. The data line DL may at least partially overlap the first pillars PR1. The data line DL may extend in the first direction (e.g., the ±x direction) to transmit data signals to a pixel circuit disposed in the first pixel area PXAR1 and a pixel circuit disposed in the second pixel area PXAR2.

Although the above description is provided with respect to the data line DL, the same may be applied to the driving voltage line PL in FIG. 8. The driving voltage line PL may be disposed on the fourth insulating layer IIL4. The driving voltage line PL may at least partially overlap the first separation area SPAR1. The driving voltage line PL may at least partially overlap the first pillars PR1. The driving voltage line PL may extend in the first direction (e.g., the ±x direction) to transmit driving voltages to a pixel circuit disposed in the first pixel area PXAR1 and a pixel circuit disposed in the second pixel area PXAR2.

Figure 11:
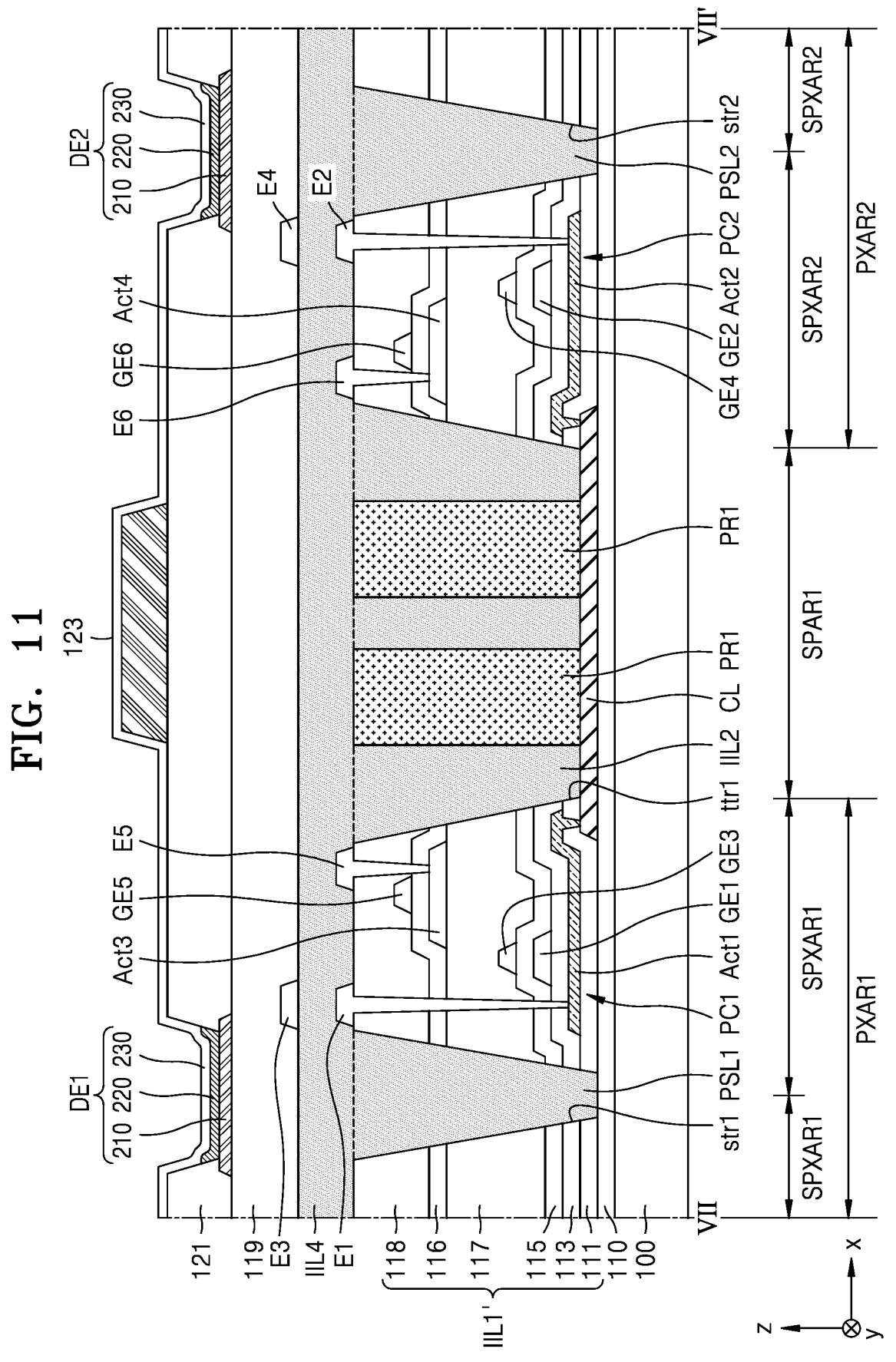
FIG. 11 is a cross-sectional view taken along line VII-VII', illustrating a portion of the display apparatus of FIG. 8.

FIG. 11 is a cross-sectional view taken along line VII-VII', illustrating a portion of the display apparatus of FIG. 8. The same reference numerals in FIGS. 9 and 11 denote the same elements, and thus, redundant descriptions thereof are omitted.

Referring to FIG. 11, a first insulating layer Kt may further include a third gate insulating layer 116 and a sixth insulating layer 118. The first pixel circuit PC1 may further include a third semiconductor layer Act3 between the inter-insulating layer 117 and the third gate insulating layer 116, and a fifth gate electrode GE5 between and the third gate insulating layer 116 and the sixth insulating layer 118. The second pixel circuit PC2 may further include a fourth semiconductor layer Act4 between the inter-insulating layer 117 and the third gate insulating layer 116, and a sixth gate electrode GE6 between and the third gate insulating layer 116 and the sixth insulating layer 118.

The third gate insulating layer 116 and the sixth insulating layer 118 may each include $SiO_2$, $SiN_x$, SiON, $Al_2O_3$, $TiO_2$, $Ta_2O_5$, $HfO_2$, or $ZnO_2$.

The third semiconductor layer Act3 and the fourth semiconductor layer Act4 may each include at least one material of In, Ga, Sn, Zr, V, Hf, Cd, Ge, Cr, Ti, Al, Cs, Ce, and Zn.

The fifth gate electrode GE5 and the sixth gate electrode GE6 may each include a conductive material including Mo, Al, Cu, or Ti, etc., and may each be a multi-layer or a single layer including the above-described materials. In an embodiment, the fifth gate electrode GE5 and the sixth gate electrode GE6 may each be a single layer including Mo, for example.

The first electrode E1 may be connected to the first semiconductor layer Act1 via at least one contact hole defined in the first gate insulating layer 113, the second gate insulating layer 115, the inter-insulating layer 117, the third gate insulating layer 116, and the sixth insulating layer 118. The second electrode E2 may be connected to the second semiconductor layer Act2 via at least one contact hole defined in the first gate insulating layer 113, the second gate insulating layer 115, the inter-insulating layer 117, the third gate insulating layer 116, and the sixth insulating layer 118.

A fifth electrode E5 and a sixth electrode E6 may be further disposed on the first insulating layer IIL1'. The fifth electrode E5 may be connected to the third semiconductor layer Act3 via at least one contact hole defined in the third gate insulating layer 116 and the sixth insulating layer 118. The sixth electrode E6 may be connected to the fourth semiconductor layer Act4 via at least one contact hole defined in the third gate insulating layer 116 and the sixth insulating layer 118. The fifth electrode E5 and the sixth electrode E6 may each include a conductive material including Mo, Al, Cu, or Ti, etc., and may each be a multi-layer or a single layer including the above-described materials. In an embodiment, the fifth electrode E5 and the sixth electrode E6 may each have a multi-layered structure of Ti/Al/Ti, for example.

Figure 12:
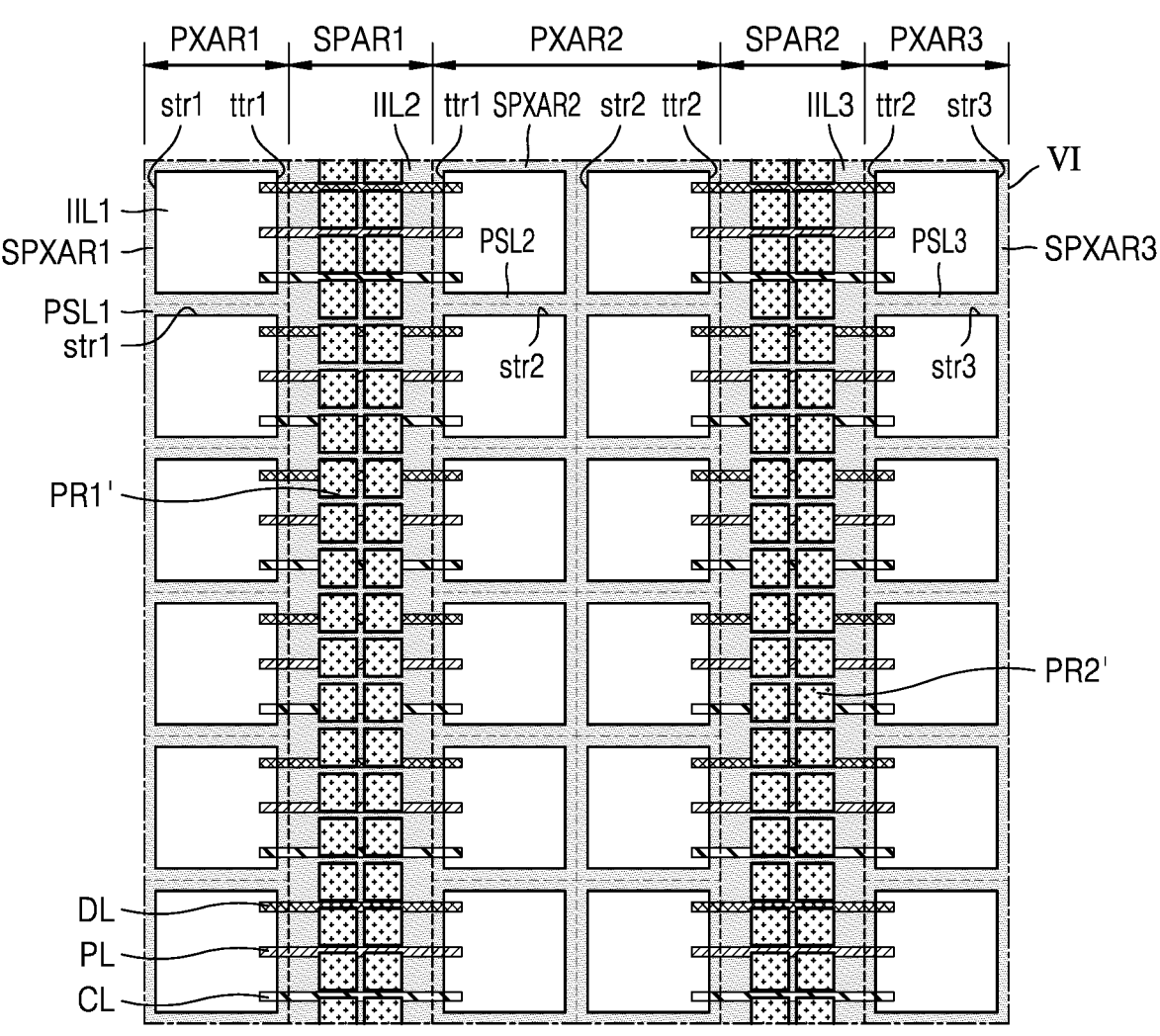
FIG. 12 is an enlarged plan view illustrating the region VI of FIG. 3.

FIG. 12 is an enlarged plan view illustrating the region VI of FIG. 3. FIG. 12 is a modification of FIG. 8, and differs therefrom in terms of the structure of a pillar. Hereinafter, redundant descriptions of FIGS. 8 and 12 are omitted, and differences therebetween are mainly described.

Referring to FIG. 12, a planar shape of a first pillar PR1' may be a polygon. In an embodiment, the planar shape of the first pillar PR1' may be a quadrangle, for example. The first pillar PR1' may be a quadrangular prism. The second insulating layer IIL2 may at least partially surround the first pillars PR1' each having a quadrangular planar shape.

Although the above description is provided with respect to the first pillar PR1', the same may be applied to a second pillar PR2'. A planar shape of the second pillar PR2' may be a polygon. In an embodiment, the planar shape of the second pillar PR2' may be a quadrangle, for example. The second pillar PR2' may be a quadrangular prism. The third insulating layer IIL3 may at least partially surround the second pillars PR2' each having a quadrangular planar shape.

Figure 13:
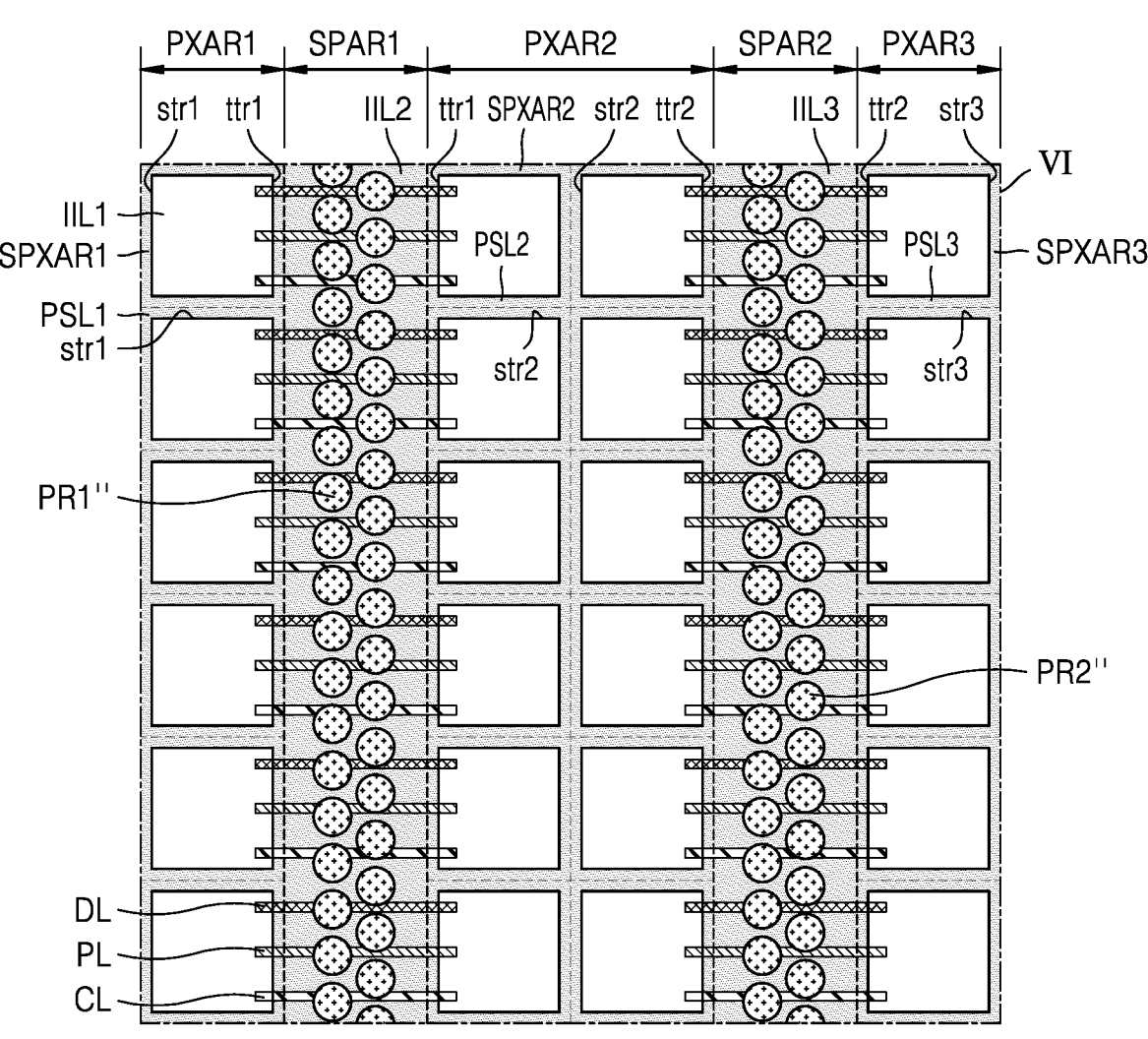
FIG. 13 is an enlarged plan view illustrating the region VI of FIG. 3.

FIG. 13 is an enlarged plan view illustrating the region VI of FIG. 3. FIG. 13 is a modification of FIG. 8, and differs therefrom in terms of the structure of a pillar. Hereinafter, redundant descriptions of FIGS. 8 and 13 are omitted, and differences therebetween are mainly described.

Referring to FIG. 13, a planar shape of a first pillar PR1" may be a circle. The first pillar PR1" may be a cylinder. The second insulating layer IIL2 may at least partially surround the first pillars PR1" each having a circular planar shape.

Although the above description is provided with respect to the first pillar PR1", the same may be applied to a second pillar PR2". A planar shape of the second pillar PR2" may be a circle. The second pillar PR2" may be a cylinder. The third insulating layer IIL3 may at least partially surround the second pillars PR2" each having a circular planar shape.

Although a display apparatus has been mainly described above, the disclosure is not limited thereto. A method of manufacturing the display apparatus also falls within the scope of the disclosure, for example.

According to the embodiments, a high-resolution display apparatus that is robust and flexible against an external impact may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a substrate in which a first pixel area, a second pixel area, and a separation area are defined, the first pixel area and the second pixel area being apart from each other, and the separation area being between the first pixel area and the second pixel area;
a first insulating layer which is disposed on the substrate and in which a trench corresponding to the separation area is defined;
a pillar disposed in the trench, a height direction of the pillar being a thickness direction of the substrate; and
a second insulating layer which is buried in the trench, surrounds at least a portion of the pillar in the trench in a direction in which the first pixel area, the second pixel area, and the separation area are arranged and comprises a material different from a material of the first insulating layer,
wherein the pillar overlaps a center of the trench and is spaced apart from an inner surface of the trench.

2. The display apparatus of claim 1, wherein a modulus of the pillar and a modulus of the second insulating layer are different from each other.

3. The display apparatus of claim 1, wherein a modulus of the pillar is greater than a modulus of the second insulating layer.

4. The display apparatus of claim 1, wherein the pillar comprises an inorganic material.

5. The display apparatus of claim 1, wherein the pillar comprises a conductive material.

6. The display apparatus of claim 1, wherein a planar shape of the pillar is a circle or a polygon.

7. The display apparatus of claim 1, wherein the first insulating layer comprises an inorganic material, and the second insulating layer comprises an organic material.

8. The display apparatus of claim 1, further comprising:
a first pixel circuit disposed in the first pixel area and comprising a first semiconductor layer;
a second pixel circuit disposed in the second pixel area and comprising a second semiconductor layer; and
a connection line extending in one direction, connecting the first semiconductor layer to the second semiconductor layer and at least partially overlapping the separation area.

9. The display apparatus of claim 8, wherein the first semiconductor layer and the second semiconductor layer are arranged in a same layer, and
the connection line is disposed between the first semiconductor layer and the substrate.

10. The display apparatus of claim 8, further comprising:
a data line which extends in the one direction on the first insulating layer and the second insulating layer, transmits a data signal to the first pixel circuit and the second pixel circuit and at least partially overlaps the separation area; and
a driving voltage line which extends in the one direction on the first insulating layer and the second insulating layer, transmits a driving voltage to the first pixel circuit and the second pixel circuit and at least partially overlaps the separation area.

11. The display apparatus of claim 1, further comprising:
a first display element disposed in the first pixel area;
a second display element disposed in the second pixel area;
a pixel-defining layer disposed on the first insulating layer and the second insulating layer and defining an emission area of each of the first display element and the second display element; and
a spacer disposed on the pixel-defining layer and at least partially overlapping the pillar.

12. The display apparatus of claim 11, wherein the pixel-defining layer and the spacer are unitary as a single body.

13. The display apparatus of claim 1, further comprising:
a first pixel circuit disposed in the first pixel area;
a second pixel circuit disposed in the second pixel area;
a third pixel circuit disposed in the first pixel area or the second pixel area;
a first display element disposed in the first pixel area and electrically connected to the first pixel circuit;
a second display element disposed in the second pixel area and electrically connected to the second pixel circuit; and
a third display element disposed in the separation area and electrically connected to the third pixel circuit.

14. The display apparatus of claim 1, wherein the first pixel area comprises a plurality of first sub-pixel areas,
the second pixel area comprises a plurality of second sub-pixel areas,
a plurality of first auxiliary trenches and a plurality of second auxiliary trenches are defined in the first insulating layer, the plurality of first auxiliary trenches respectively corresponding to boundaries of the plurality of first sub-pixel areas, and the plurality of second auxiliary trenches respectively corresponding to boundaries of the plurality of second sub-pixel areas, and
the display apparatus further comprises:
a plurality of first pixel isolation layers respectively buried in the plurality of first auxiliary trenches and each comprising a material different from a material of the first insulating layer; and
a plurality of second pixel isolation layers respectively buried in the plurality of second auxiliary trenches and each comprising a material different from a material of the first insulating layer.

15. The display apparatus of claim 14, further comprising:
a plurality of first pixel circuits respectively arranged in first sub-pixel areas among the plurality of first sub-pixel areas;
a plurality of second pixel circuits respectively arranged in second sub-pixel areas among the plurality of second sub-pixel areas;
a plurality of third pixel circuits respectively arranged in other first sub-pixel areas among the plurality of first sub-pixel areas and other second sub-pixel areas among the plurality of second sub-pixel areas;
a plurality of first display elements arranged in the first pixel area and electrically and respectively connected to the plurality of first pixel circuits;
a plurality of second display elements arranged in the second pixel area and electrically and respectively connected to the plurality of second pixel circuits; and
a plurality of third display elements arranged in the separation area and electrically and respectively connected to the plurality of third pixel circuits.

16. The display apparatus of claim 15, wherein two first pixel circuits among the plurality of first pixel circuits are arranged between adjacent third pixel circuits arranged in the first pixel area, among the plurality of third pixel circuits, and
two second pixel circuits among the plurality of second pixel circuits are arranged between adjacent third pixel circuits arranged in the second pixel area, among the plurality of third pixel circuits.

17. The display apparatus of claim 14, wherein the plurality of first pixel isolation layers and the plurality of second pixel isolation layers each comprise a same material as a material of the second insulating layer.

18. The display apparatus of claim 1, wherein the pillar comprises a plurality of pillars, the plurality of pillars is arranged apart from each other, and the second insulating layer surrounds at least a portion of each of the plurality of pillars.

19. The display apparatus of claim 18, wherein, in a plan view, the second insulating layer has a honeycomb structure.

20. The display apparatus of claim 1, wherein a folding area and a non-folding area are further defined in the substrate, the folding area and the non-folding area each comprising the first pixel area, the second pixel area, and the separation area, and a length direction of each of the first pixel area, the second pixel area, and the separation area is parallel to a folding axis of the folding area.

* * * * *